(12) United States Patent
Nishimura

(10) Patent No.: US 10,115,651 B2
(45) Date of Patent: Oct. 30, 2018

(54) ELECTRONIC COMPONENT HAVING A CHIP MOUNTED ON A SUBSTRATE WITH A SEALING RESIN AND MANUFACTURING METHOD THEREOF

(71) Applicant: ROHM CO., LTD., Kyoto (JP)

(72) Inventor: Isamu Nishimura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/583,362

(22) Filed: May 1, 2017

(65) Prior Publication Data
US 2017/0317000 A1    Nov. 2, 2017

(30) Foreign Application Priority Data
May 2, 2016   (JP) ................. 2016-092782

(51) Int. Cl.
| H01L 23/31 | (2006.01) |
| H01L 21/56 | (2006.01) |
| H01L 23/00 | (2006.01) |
| H01L 25/065 | (2006.01) |
| H01L 23/13 | (2006.01) |

(52) U.S. Cl.
CPC ........ H01L 23/3157 (2013.01); H01L 21/563 (2013.01); H01L 23/13 (2013.01); H01L 23/3121 (2013.01); H01L 24/82 (2013.01); H01L 25/0657 (2013.01)

(58) Field of Classification Search
CPC ............ H01L 23/3157; H01L 25/0657; H01L 21/563; H01L 24/82; H01L 23/31; H01L 21/56; H01L 23/00; H01L 25/065

USPC ........ 257/737, 738, 778, 734, 698, 690–693
See application file for complete search history.

(56) References Cited

U.S. PATENT DOCUMENTS

| 8,763,242 B2* | 7/2014 | Kawano ................. H01L 23/66 29/829 |
| 2008/0179738 A1* | 7/2008 | Nishimura ............ H01L 21/563 257/737 |
| 2008/0290491 A1* | 11/2008 | Yamano ................ H01L 25/105 257/686 |
| 2011/0244636 A1* | 10/2011 | Kondo .............. H01L 23/49822 438/127 |
| 2014/0268574 A1* | 9/2014 | Itoi ..................... H01L 23/5389 361/712 |
| 2015/0279759 A1* | 10/2015 | Miyakoshi .............. H01L 24/17 257/738 |
| 2016/0057863 A1* | 2/2016 | Kyozuka ............... H01L 21/486 361/764 |
| 2017/0071058 A1* | 3/2017 | Ueki ....................... H01L 23/12 |

(Continued)

FOREIGN PATENT DOCUMENTS

JP    2013-197263 A    9/2013

*Primary Examiner* — Alexander Oscar Williams
(74) *Attorney, Agent, or Firm* — Rabin & Berdo, P.C.

(57) ABSTRACT

An electronic component includes a substrate that has a first principal surface and a second principal surface, a chip that includes a mounting surface on which a plurality of terminal electrodes are formed and a non-mounting surface positioned on a side opposite to the mounting surface and that is arranged at the first principal surface of the substrate in a posture in which the mounting surface faces the first principal surface of the substrate, and a sealing resin that seals the chip at the first principal surface of the substrate so as to expose the non-mounting surface of the chip.

21 Claims, 23 Drawing Sheets

(56) References Cited

U.S. PATENT DOCUMENTS

2017/0148718 A1\* 5/2017 Morita .............. H01L 23/49838
2017/0294322 A1\* 10/2017 Morita .................. H01L 21/563

\* cited by examiner

ELECTRONIC COMPONENT HAVING A CHIP MOUNTED ON A SUBSTRATE WITH A SEALING RESIN AND MANUFACTURING METHOD THEREOF

BACKGROUND OF THE INVENTION

1. Field of the Invention

The present invention relates to an electronic component and a method for manufacturing the electronic component.

2. Description of the Related Art

A chip that is made up of a monofunctional element or a chip that is made up of a multifunctional element is included in chips to be mounted on a mounting substrate. The monofunctional element includes a resistance, a capacitor, a coil, a diode, a transistor, or the like. The multifunctional element includes a plurality of monofunctional elements.

A wiring layout of a mounting substrate is ordinarily set on the basis of the electrode pitch of a chip. However, there is a case in which a wiring pitch of the mounting substrate is compelled to be set more largely than the electrode pitch of the chip, owing to the wiring layout. In this case, the chip is mounted on the mounting substrate via a substrate for pitch conversion called an interposer.

An example of a structure in which a chip is arranged at an interposer is disclosed in JP2013-197263. In JP2013-197263, a semiconductor device that includes a wiring body (interposer) having one surface and one other surface, an outer terminal formed at the one surface of the wiring body, a semiconductor chip arranged at the one other surface of the wiring body, and a sealing resin that seals the semiconductor chip at the one other surface of the wiring body.

SUMMARY OF THE INVENTION

One preferred embodiment of the present invention provides an electronic component including a substrate that has a first principal surface and a second principal surface, a chip that includes a mounting surface on which a plurality of terminal electrodes are formed and a non-mounting surface positioned on a side opposite to the mounting surface and that is arranged at the first principal surface of the substrate in a posture in which the mounting surface faces the first principal surface of the substrate, and a sealing resin that seals the chip at the first principal surface of the substrate so as to expose the non-mounting surface of the chip.

One preferred embodiment of the present invention further provides a method for manufacturing an electronic component including preparing a substrate that has a first principal surface and a second principal surface, preparing a chip including a mounting surface on which a plurality of terminal electrodes are formed and a non-mounting surface positioned on a side opposite to the mounting surface, arranging the chip at the first principal surface of the substrate in a posture in which the mounting surface faces the first principal surface of the substrate, and forming a sealing resin that seals the chip so as to expose the non-mounting surface of the chip at the first principal surface of the substrate.

The aforementioned or other objects, features, and effects of the present invention will be clarified by the following description of preferred embodiments given below with reference to the accompanying drawings.

DETAILED DESCRIPTION OF THE PREFERRED EMBODIMENTS

The chip disclosed in JP2013-197263 is covered entirely with the sealing resin. The heat generated at the chip is therefore liable to accumulate inside the sealing resin. The temperature of the chip is thereby rose.

The preferred embodiments of the present invention therefore provide an electronic component capable of restraining a rise in temperature of a chip and a method for manufacturing thereof.

One preferred embodiment of the present invention provides an electronic component including a substrate that has a first principal surface and a second principal surface, a chip that includes a mounting surface on which a plurality of terminal electrodes are formed and a non-mounting surface positioned on a side opposite to the mounting surface and that is arranged at the first principal surface of the substrate in a posture in which the mounting surface faces the first principal surface of the substrate, and a sealing resin that seals the chip at the first principal surface of the substrate so as to expose the non-mounting surface of the chip.

According to this electronic component, the non-mounting surface of the chip is exposed from the sealing resin. The heat generated at the chip can thus be dissipated to outside via the non-mounting surface. A rise in temperature of the chip and a rise in temperature of an inside of the sealing resin can thus be restrained. The electronic component being excellent in reliability can thereby be provided.

One preferred embodiment of the present invention provides a method for manufacturing an electronic component including preparing a substrate that has a first principal surface and a second principal surface, preparing a chip including a mounting surface on which a plurality of terminal electrodes are formed and a non-mounting surface positioned on a side opposite to the mounting surface, arranging the chip at the first principal surface of the substrate in a posture in which the mounting surface faces the first principal surface of the substrate, and forming a sealing resin that seals the chip so as to expose the non-mounting surface of the chip at the first principal surface of the substrate.

According to this method for manufacturing the electronic component, the electronic component having a structure in which the non-mounting surface of the chip is exposed from the sealing resin can be manufactured. According to this electronic component, the heat generated at the chip can thus be dissipated to outside via the non-mounting surface. A rise in temperature of the chip and a rise in temperature of an inside of the sealing resin can thus be restrained. The electronic component being excellent in reliability can thereby be manufactured and provided.

Hereinafter, preferred embodiments of the present invention will be described in detail with reference to the accompanying drawings.

Figure 1:
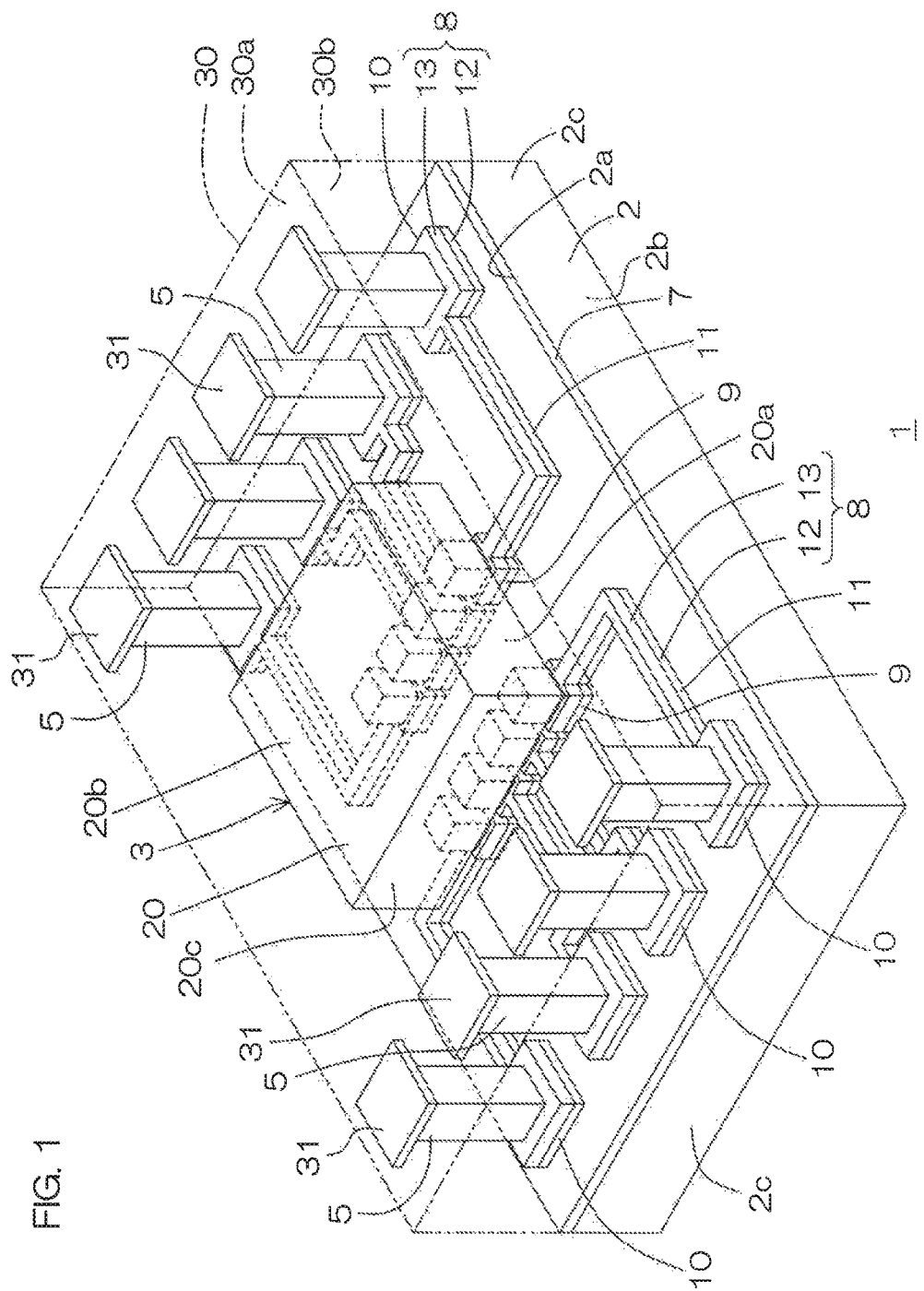
FIG. 1 is a perspective view showing an internal structure of an electronic component according to a first preferred embodiment of the present invention.
Figure 2:
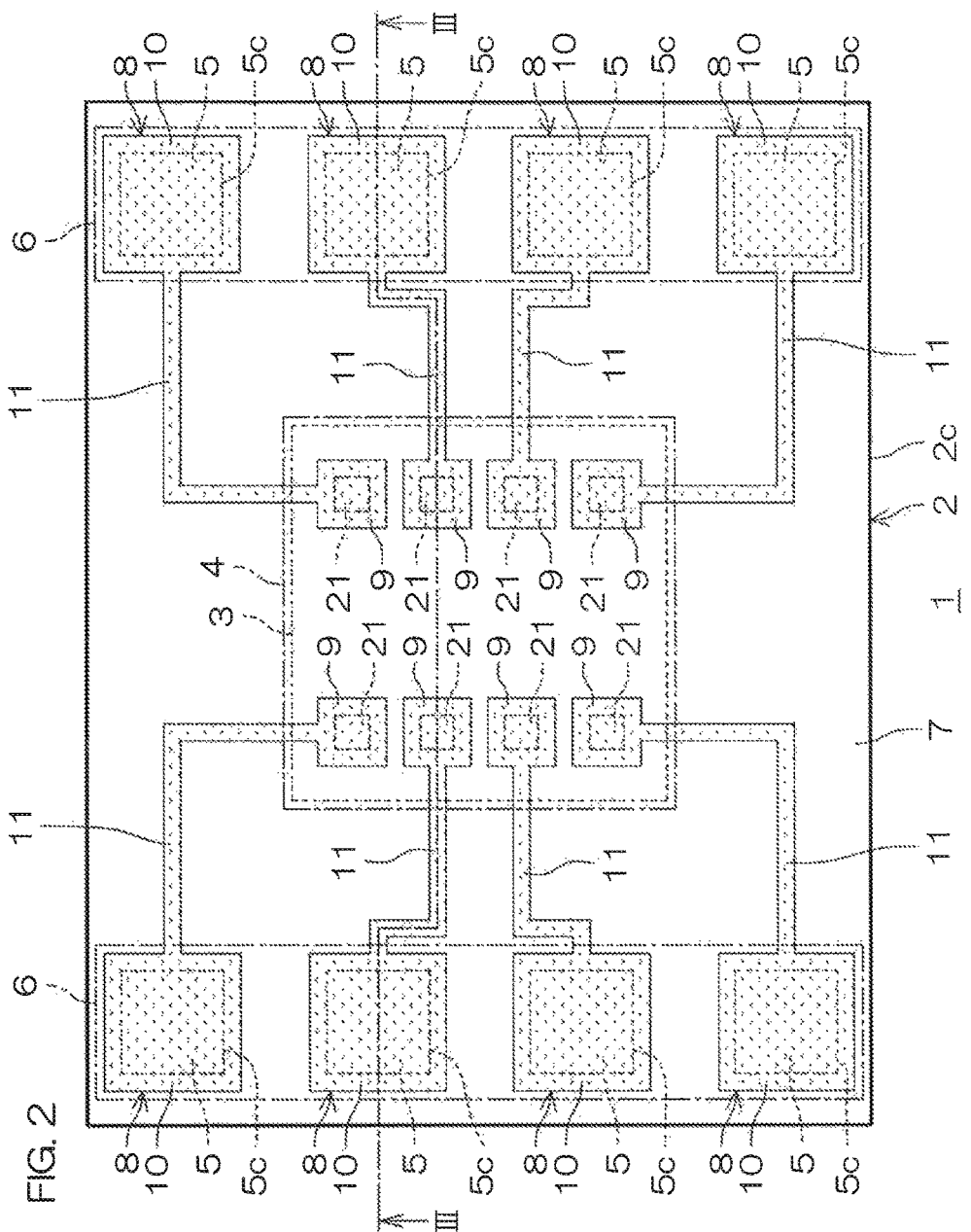
FIG. 2 is a plan view showing the electronic component of FIG. 1.
Figure 3:
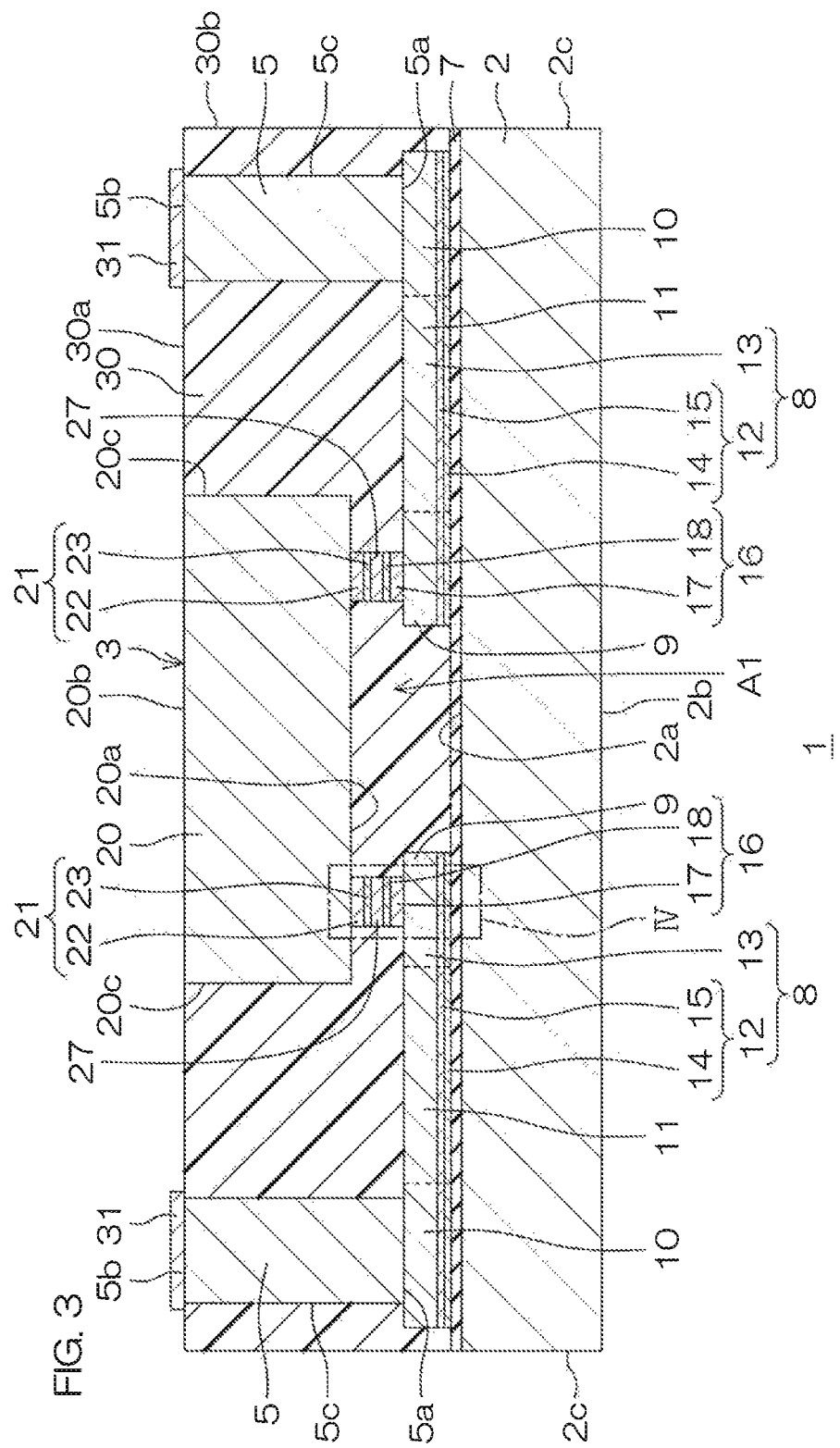
FIG. 3 is a cross-sectional view taken along line of FIG. 2.
Figure 4:
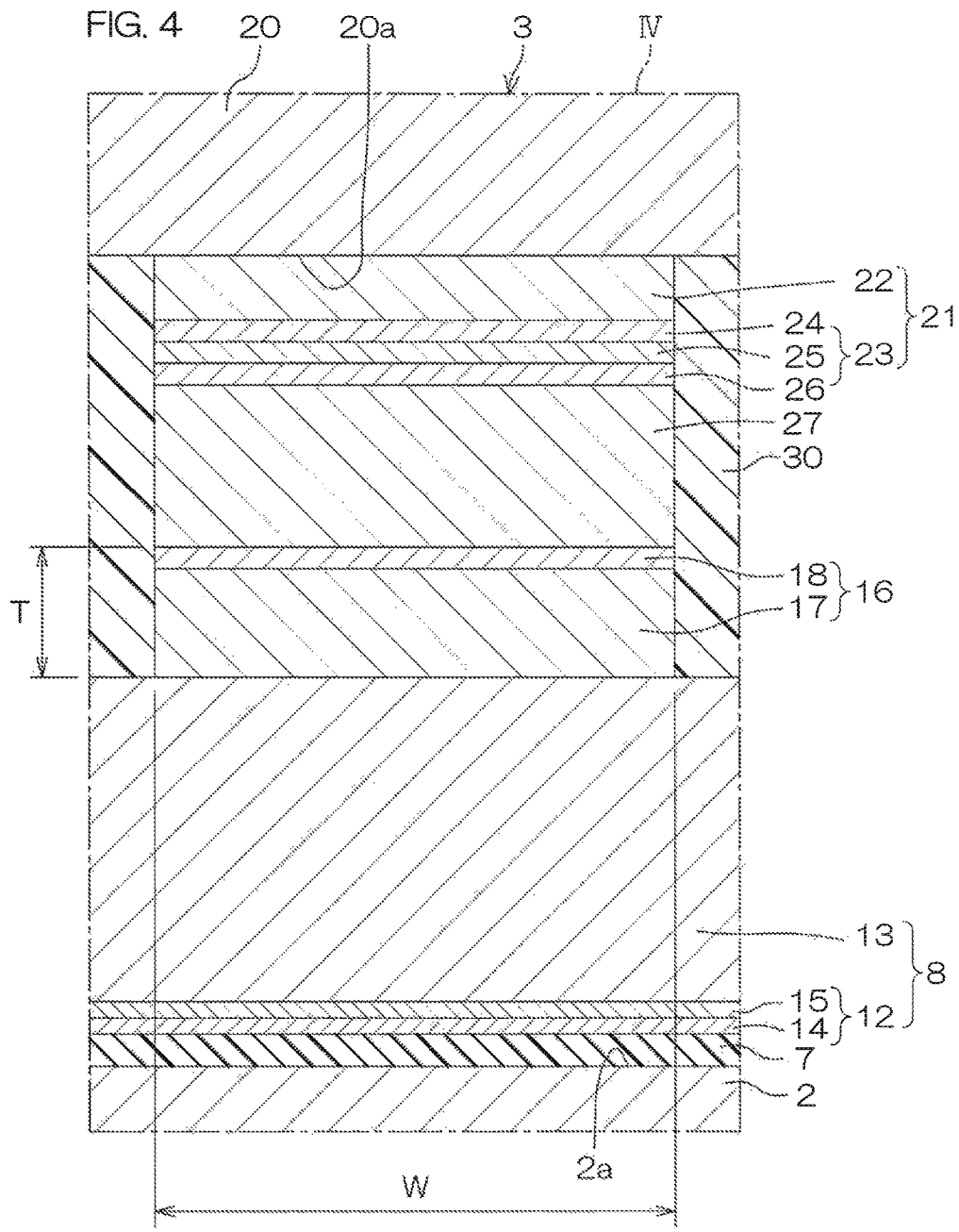
FIG. 4 is an enlarged view of region IV of FIG. 3.

FIG. 1 is a perspective view showing an internal structure of an electronic component 1 according to a first preferred embodiment of the present invention while seeing through a sealing resin 30. FIG. 2 is a plan view showing the electronic component 1 of FIG. 1. FIG. 3 is a cross-sectional view taken along line III-III of FIG. 2. FIG. 4 is an enlarged view of region IV of FIG. 3.

The electronic component 1 includes an interposer 2 made of silicon as an example of a substrate. The interposer 2 may be adopted instead of the interposer 2 made of silicon. The insulating material may include organic insulating materials, such as epoxy resin and acrylic resin. The insulating material may include inorganic insulating materials, such as glass ($SiO_2$).

The interposer 2 has a first principal surface 2a, a second principal surface 2b positioned on a side opposite to the first principal surface 2a, and side surfaces 2c that connect the first principal surface 2a and the second principal surface 2b. The first principal surface 2a and the second principal surface 2b of the interposer 2 are each formed in a rectangular shape in a plan view as viewed from their normal directions (hereinafter referred to simply as "plan view"). The first principal surface 2a and the second principal surface 2b of the interposer 2 have flat surfaces parallel to each other.

Hereinafter, side surfaces 2c that extend in a short-side lateral direction of the interposer 2 among the side surfaces 2c of the interposer 2 are each referred to as a short-side surface 2c.

A chip arrangement region 4 and an outer terminal arrangement region 6 are set at the first principal surface 2a of the interposer 2. The chip arrangement region 4 is a region in which a chip 3 is arranged. The outer terminal arrangement region 6 is a region in which a plurality of outer terminals 5 are arranged.

The chip arrangement region 4 is set at a central portion of the first principal surface 2a of the interposer 2. The chip arrangement region 4 is set in a quadrangular shape parallel to each side of the interposer 2 in plan view.

The outer terminal arrangement region 6 is set at a region around the chip arrangement region 4 in the first principal surface 2a of the interposer 2. The outer terminal arrangement region 6 is set at a region closer to one short-side surface 2c of the interposer 2 than the chip arrangement region 4.

The outer terminal arrangement region 6 is also set at a region closer to the other short-side surface 2c of the interposer 2 than the chip arrangement region 4. Each outer terminal disposition region 6 is set in a rectangular shape extending along the short-side lateral direction of the interposer 2 in plan view.

An insulating film 7 is formed on the first principal surface 2a of the interposer 2. The insulating film 7 covers a whole region of the first principal surface 2a of the interposer 2. The insulating film 7 may be a nitride film (an SiN film) or may be an oxide film (an $SiO_2$ film).

A plurality of wiring films 8 (in the present preferred embodiment, eight wiring films) are formed on the insulating film 7. For clarity, the plurality of wiring films 8 are depicted by hatching in FIG. 2.

Each of the plurality of wiring films 8 includes a first pad region 9, a second pad region 10, and a connection region 11. The first pad region 9 is arranged in the chip arrangement region 4. The second pad region 10 is arranged in the outer terminal arrangement region 6. The connection region 11 connects the first pad region 9 and the second pad region 10.

Four first pad regions 9 are arranged in a region at the one short-side surface 2c side of the interposer 2 in the chip arrangement region 4. These four first pad regions 9 are arranged at intervals along the short-side lateral direction of the interposer 2.

Four first pad regions 9 are arranged in a region at the other short-side surface 2c side of the interposer 2 in the chip arrangement region 4. These four first pad regions 9 are arranged at intervals along the short-side lateral direction of the interposer 2. Each of the first pad regions 9 may be formed in a quadrangular shape in plan view.

Four second pad regions 10 are arranged in the outer terminal arrangement region 6 at the one short-side surface 2c side of the interposer 2. These four second pad regions 10 are arranged at intervals along the short-side lateral direction of the interposer 2.

Four second pad regions 10 are arranged in the outer terminal arrangement region 6 at the other short-side surface 2c side of the interposer 2. These four second pad regions 10 are arranged at intervals along the short-side lateral direction of the interposer 2. Each of the second pad regions 10 may be formed in a quadrangular shape in plan view.

The connection region 11 is connected to the corresponding first pad region 9 and to the corresponding second pad region 10. The connection region 11 is selectively laid around in a region between the corresponding first pad region 9 and the corresponding second pad region 10.

Referring to FIG. 3 and FIG. 4, each wiring film 8 has a laminated structure that includes a seed layer 12 and a conductive layer 13 laminated on the seed layer 12. The seed layer 12 has a laminated structure that includes a Ti film 14 and a Cu film 15 laminated in this order from the interposer 2 side.

The conductive layer 13 forms a main body of the wiring film 8. The conductive layer 13 has a single-layer structure including a Cu layer in the present preferred embodiment. A thickness of the conductive layer 13 is greater than a thickness of the seed layer 12. Wiring resistance is lowered by the conductive layer 13.

A connecting electrode 16 is connected to a portion positioned at the chip arrangement region 4 in the plurality of wiring films 8. More specifically, the connecting electrode 16 is connected to the first pad region 9 of the wiring film 8. The connecting electrode 16 is erected upwardly from the wiring film 8. The connecting electrode 16 is formed in a block shape, a pillar shape, or a column shape.

Referring to FIG. 3 and FIG. 4, the connecting electrode 16 has a laminated structure that includes a main body portion 17 and a barrier layer 18 laminated in this order from the wiring film 8 side.

The main body portion 17 of the connecting electrode 16 includes Cu. The barrier layer 18 of the connecting electrode 16 includes Ni. An aspect ratio T/W of the connecting electrode 16 is equal to or smaller than 1 (T/W≤1). According to this aspect ratio T/W, the connecting electrode 16 can thus be formed in a well-balanced state. The aspect ratio T/W of the connecting electrode 16 is defined by a ratio of a height T of the connecting electrode 16 with respect to a width W of the connecting electrode 16.

Referring to FIG. 1 to FIG. 3, the chip 3 is arranged in the chip arrangement region 4. The chip 3 includes a chip body 20. The chip body 20 is formed in a rectangular parallelepiped shape. The chip body 20 may be made of silicon, GaAs, or an insulating material. The insulating material may include glass or ceramic.

The chip body 20 has a mounting surface 20a, a non-mounting surface 20b positioned on a side opposite to the mounting surface 20a, and side surfaces 20c that connect the mounting surface 20a and the non-mounting surface 20b.

The mounting surface 20a is a facing surface that faces the interposer 2 when the chip 3 is mounted on the interposer 2.

The mounting surface 20a of the chip body 20 may be a functional element forming surface on which a functional element is formed. The functional element may include at least one of a resistor, a capacitor, a coil, a diode, or a transistor. The chip 3 may be a chip including a monofunctional element, or may be a chip that includes an integrated circuit having a plurality of functional elements.

A plurality of terminal electrodes 21 are formed on the mounting surface 20a of the chip body 20. The plurality of terminal electrodes 21 are electrically connected to the functional element.

An insulating layer may be formed on the mounting surface 20a of the chip body 20. In this case, the plurality of terminal electrodes 21 may protrude outwardly from the insulating layer. A wiring layer including a plurality of wires that electrically connect the plurality of terminal electrodes 21 and the functional elements may be selectively formed in the insulating layer.

Referring to FIG. 3 and FIG. 4, each of the plurality of terminal electrodes 21 has a laminated structure that includes a main body portion 22 and a barrier layer 23 laminated in this order from the mounting surface 20a side of the chip body 20. The main body portion 22 of the terminal electrode 21 includes Cu. The barrier layer 23 of the terminal electrode 21 includes Ni.

More specifically, the barrier layer 23 of the terminal electrode 21 has a laminated structure including an Ni layer 24, a Pd layer 25, and an Au layer 26 that are laminated in this order from the main body portion 22 side.

The chip 3 is arranged at the first principal surface 2a of the interposer 2 in a posture in which the mounting surface 20a of the chip body 20 faces the first principal surface 2a of the interposer 2. The plurality of terminal electrodes 21 of the chip 3 are connected to corresponding wiring films 8 via the connecting electrodes 16, respectively. The chip 3 is thus electrically connected to the plurality of wiring films 8.

The terminal electrode 21 may be bonded to the connecting electrode 16 via a conductive bonding material 27. The conductive bonding material 27 may be solder or metallic paste. A solder is adopted as the conductive bonding material 27, in the present preferred embodiment.

The barrier layer 18 of the connecting electrode 16 restrains the solder from diffusing into the main body portion 17 of the connecting electrode 16. The barrier layer 23 of the terminal electrode 21 restrains the solder from diffusing into the main body portion 22 of the terminal electrode 21.

The main body portion 17 of the connecting electrode 16 and the main body portion 22 of the terminal electrode 21 may be directly connected without interposing the conductive bonding material 27. The main body portion 17 of the connecting electrode 16 and the main body portion 22 of the terminal electrode 21 may be connected to each other by a known ultrasonic connecting method.

The chip 3 is arranged at intervals upwardly from the first principal surface 2a of the interposer 2 by an amount corresponding to the height T of the connecting electrode 16. A space A1 having a predetermined height is thus formed in a region between the mounting surface 20a of the chip body 20 and the first principal surface 2a of the interposer 2.

A plurality of outer terminals 5 are arranged at the outer terminal arrangement region 6. Each outer terminal 5 is formed in a block shape, a pillar shape, or in a column shape. Each outer terminal 5 is erected on the second pad region 10 of each wiring film 8.

Each of the plurality of outer terminals 5 includes an end surface 5a, an opposite end surface 5b positioned on a side opposite to the end surface 5a, and side surfaces 5c that connects the end surface 5a and the opposite end surface 5b. The end surface 5a of each outer terminal 5 is connected to the second pad region 10 of each wiring film 8.

A sealing resin 30 is formed at the first principal surface 2a of the interposer 2. The sealing resin 30 is shown by the imaginary line in FIG. 1. The sealing resin 30 may include an epoxy resin, a polyimide resin, or an acrylic resin.

The sealing resin 30 seals the chip 3 so as to expose a whole region of the non-mounting surface 20b of the chip body 20. The sealing resin 30 fills the space A1, and covers the whole region of the side surfaces 20c of the chip body 20. The sealing resin 30 seals each outer terminal 5 so as to expose a whole region of the opposite end surface 5b of each outer terminal 5.

The sealing resin 30 includes a sealing principal surface 30a that faces the first principal surface 2a of the interposer 2 and sealing side surfaces 30b that extends from the sealing principal surface 30a toward the interposer 2 side. The sealing side surfaces 30b of the sealing resin 30 are connected to the side surfaces 2c of the interposer 2 without differences in level.

The sealing principal surface 30a of the sealing resin 30 is connected to the non-mounting surface 20b of the chip body 20 without differences in level. The sealing principal surface 30a of the sealing resin 30 is connected to the opposite end surface 5b of each outer terminal 5 without differences in level.

The non-mounting surface 20b of the chip body 20, the opposite end surface 5b of each outer terminal 5, and the sealing principal surface 30a of the sealing resin 30 form a single flat surface. This single flat surface is formed in parallel with the first principal surface 2a and the second principal surface 2b of the interposer 2.

An external conductive film 31 is connected to the opposite end surface 5b of each outer terminal 5. The external conductive film 31 may have a laminated structure including an Ni layer, a Pd layer, and an Au layer that are laminated in this order from the opposite end surface 5b side of the outer terminal 5. The external conductive film 31 may cover a whole region of the opposite end surface 5b of the outer terminal 5. The external conductive film 31 may overlap to the sealing principal surface 30a of the sealing resin 30.

As described above, according to the electronic component 1, the non-mounting surface 20b of the chip 3 is exposed from the sealing resin 30. The heat generated at the chip 3 can thus be dissipated to outside via the non-mounting surface 20b. A rise in temperature of the chip 3 and a rise in temperature of an inside of the sealing resin 30 can thereby be restrained.

Particularly, according to the electronic component 1, the whole region of the non-mounting surface 20b of the chip body 20 is exposed from the sealing resin 30. The heat generated at the chip 3 can thus be dissipated to outside via the whole region of the non-mounting surface 20b. The rise in temperature of the chip 3 can thereby be effectively restrained. The electronic component 1 being excellent in reliability can thereby be provided.

According to the electronic component 1, the space A1 is formed between the mounting surface 20a of the chip body 20 and the first principal surface 2a of the interposer 2 by the plurality of connecting electrodes 16. This space A1 is set to a height enough to fill the sealing resin 30.

The sealing resin 30 can thus be satisfactorily filled in a region between the mounting surface 20a of the chip body 20 and the first main surface 2a of the interposer 2 by the space A1. A formation of a void (empty hole) in the sealing resin 30 that is filled into the space A1 can thus be restrained.

A whole region of each outer surface of the connecting electrode 16, the terminal electrode 21, and the conductive bonding material 27 can thus be coated with the sealing resin 30. Corrosion of the connecting electrode 16, the terminal electrode 21, and the conductive bonding material 27 by moisture to be stored in the void (empty hole) can thereby be restrained.

Figure 5:
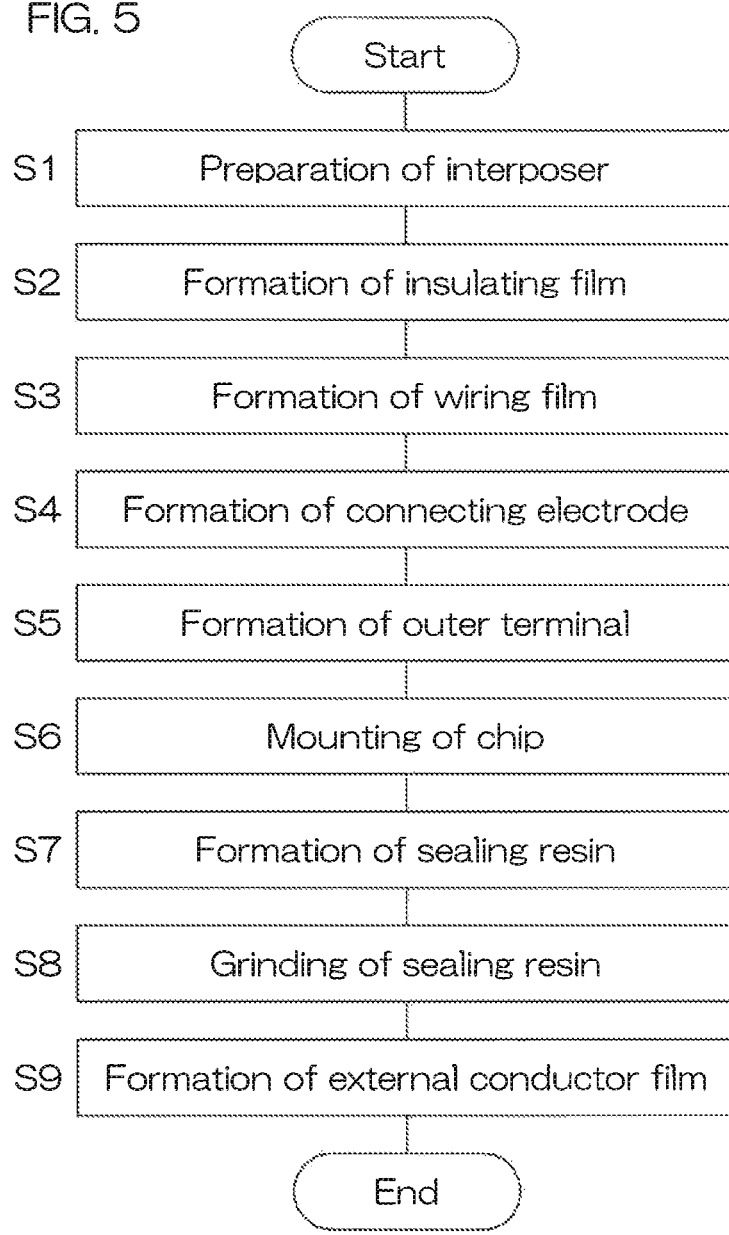
FIG. 5 is a flowchart of a method for manufacturing the electronic component of FIG. 1.

FIG. 5 is a flowchart of a method for manufacturing the electronic component 1 of FIG. 1.

The interposer 2 that has the first principal surface 2a and the second principal surface 2b is prepared to manufacture the electronic component 1 (step S1). The interposer 2 that is made of silicon is prepared, in the present preferred embodiment.

Next, the insulating film 7 (in the present preferred embodiment, the SiO$_2$ film) is formed at the first principal surface 2a of the interposer 2 by, for example, a CVD method or a thermal oxidation treatment (step S2).

Next, the plurality of wiring films 8 are formed on the insulating film 7 (step S3). In the step of forming the wiring films 8, first, the seed layer 12 including the Ti film 14 and the Cu film 15 is formed on the insulating film 7. The Ti film 14 and the Cu film 15 may be formed by a sputtering method. In the sputtering method, Ti and Cu are deposited on the insulating film 7 in this order.

Next, the conductive layer 13 made of Cu is formed on the seed layer 12. The conductive layer 13 may be formed by an electrolytic copper plating method.

Next, a mask that has a predetermined pattern is formed on the conductive layer 13. The mask selectively covers regions in which the wiring films 8 are to be formed. Next, unnecessary portions of the seed layer 12 and of the conductive layer 13 are removed by an etching method via the mask. The plurality of wiring films 8 each of which has a predetermined pattern is thereby formed.

The plurality of wiring films 8 are also formed through the following steps. First, the seed layer 12 including the Ti film 14 and the Cu film 15 is formed on the insulating film 7. The Ti film 14 and the Cu film 15 may be formed by a sputtering method. In the sputtering method, Ti and Cu are layered on the insulating film 7 in this order.

Next, a mask that has a predetermined pattern is formed on the seed layer 12. The mask selectively covers a region in which the plurality of wiring films 8 are to be formed. Next, unnecessary portions of the seed layer 12 are removed by an etching via the mask.

Next, another mask that has a predetermined pattern is formed on the insulating film 7. The mask includes an opening having a shape matching a shape of the seed layer 12.

Next, a conductive layer 13 made of Cu is formed on the seed layer 12. The conductive layer 13 may be formed by an electrolytic copper plating method. The plurality of wiring films 8 having a predetermined pattern are thereby formed.

Next, the plurality of connecting electrodes 16 are formed (step S4). In the step of forming the connecting electrodes 16, first, a mask that has a predetermined pattern is formed on the insulating film 7. The mask has an opening that selectively exposes the first pad region 9 of each wiring film 8.

Next, Cu and Ni are layered in this order on the first pad region 9 exposed from the opening of the mask by an electrolytic plating method. The plurality of connecting electrodes 16 having the laminated structure that includes the main body portion 17 including Cu and the barrier layer 18 including Ni. The mask is removed thereafter.

Next, the plurality of outer terminals 5 are formed (step S5). In the step of forming the outer terminals 5, first, a mask that has a predetermined pattern is formed on the insulating film 7. The mask has an opening that selectively exposes the second pad region 10 of each wiring film 8.

Next, Cu is layered on the second pad region 10 exposed from the opening of the mask by an electrolytic plating method. The plurality of outer terminals 5 having a block shape, a pillar shape or a columnar shape are formed. The mask is removed thereafter.

Next, the chip 3 is mounted on the interposer 2 (step S6). The chip 3 is connected to the plurality of wiring films 8 in a state in which the mounting surface 20a faces the first principal surface 2a of the interposer 2. The arrangement of the chip 3 and a connection mode of the chip 3 with respect to each wiring film 8 are executed in the same manner as described with reference to FIG. 1 to FIG. 4, and therefore detailed descriptions thereof are omitted.

Next, the sealing resin 30 is formed on the first principal surface 2a of the interposer 2 (step S7). In this step, the whole region of the chip 3 and the whole region of each outer terminal 5 are coated with the sealing resin 30.

Next, the sealing principal surface 30a of the sealing resin 30 is ground until the non-mounting surface 20b of the chip body 20 is exposed (step S8). In this step, the sealing principal surface 30a of the sealing resin 30 is ground until the opposite end surface 5b of each outer terminal 5 is exposed, in addition to the non-mounting surface 20b of the chip body 20.

This grinding step also serves as a step of thinning the chip 3 by grinding the non-mounting surface 20b of the chip 3 at the same time as the sealing principal surface 30a of the sealing resin 30 is ground. A thickness of the electronic component 1 is adjusted in addition to the thickness of the chip 3.

Next, the plurality of external conductive films 31 are formed (step S9). In this step, first, a mask that has a predetermined pattern is formed on the sealing principal surface 30a of the sealing resin 30. The mask has an opening that selectively exposes the opposite end surface 5b of each outer terminal 5.

Next, Ni, Pd, and Au are layered in this order by an electrolytic plating method. The plurality of external conductive films 31 are formed. The mask is removed thereafter. An electronic component 1 is manufactured through these steps.

As described above, according to the manufacturing method of the electronic component 1, the electronic component 1 having a structure in which the non-mounting surface 20b of the chip 3 is exposed from the sealing resin 30 can be manufactured. The heat generated at the chip 3 can thus be dissipate to outside via the non-mounting surface 20b. The rise in temperature of the chip 3 and the rise in temperature of the inside of the sealing resin 30 can thus be restrained. The electronic component 1 being excellent in reliability can thereby be manufactured and provided.

According to the manufacturing method of the electronic component 1, the non-mounting surface 20b of the chip 3 is exposed by grinding the sealing principal surface 30a of the sealing resin 30 (step S8). The whole region of the non-mounting surface 20b of the chip 3 can thereby be exposed from the sealing resin 30 without consuming much time.

According to the manufacturing method of the electronic component 1, the grinding step (step S8) also serves as the step of thinning the chip 3. The thickness of the electronic component 1 in addition to the thickness of the chip 3 can thus be adjusted. A miniaturization in size of the electronic component 1 can thereby be achieved.

According to the manufacturing method of the electronic component 1, the chip 3 can be ground in a state in which the whole region of the outer surface of the chip 3 is protected by the sealing resin 30 in the grinding step (step S8). An occurrence of a crack in the outer surface of the chip 3 can thus be restrained. A miniaturization in size of the electronic component 1 by realizing a low profile can thereby be achieved.

Here, a case in which the chip 3 includes the chip body 20 that is a gallium arsenide (GaAs) based shall now be considered. The chip body 20 that is a gallium arsenide (GaAs) based has the property of causing a crack or the like because of grinding or the like more easily than the chip body 20 that is silicon (Si)-based. A low profile of the chip 3 by the grinding is therefore difficult to achieve in the chip body 20 that is a gallium arsenide (GaAs) based.

On the other hand, according to the manufacturing method of the electronic component 1, the non-mounting surface 20b of the chip 3 can be ground in a state in which the whole region of the outer surface of the chip 3 is protected by the sealing resin 30. The occurrence of a crack caused by grinding can thereby be restrained even when the chip body 20 that is a gallium arsenide (GaAs) based is adopted.

The structure in which the non-mounting surface 20b of the chip 3 is exposed from the sealing resin 30 can thus be appropriately formed even when the chip body 20 that is a gallium arsenide (GaAs) based is adopted. A reduction in size of the electronic component 1 by realizing a low profile can be achieved simultaneously therewith.

Figure 6:
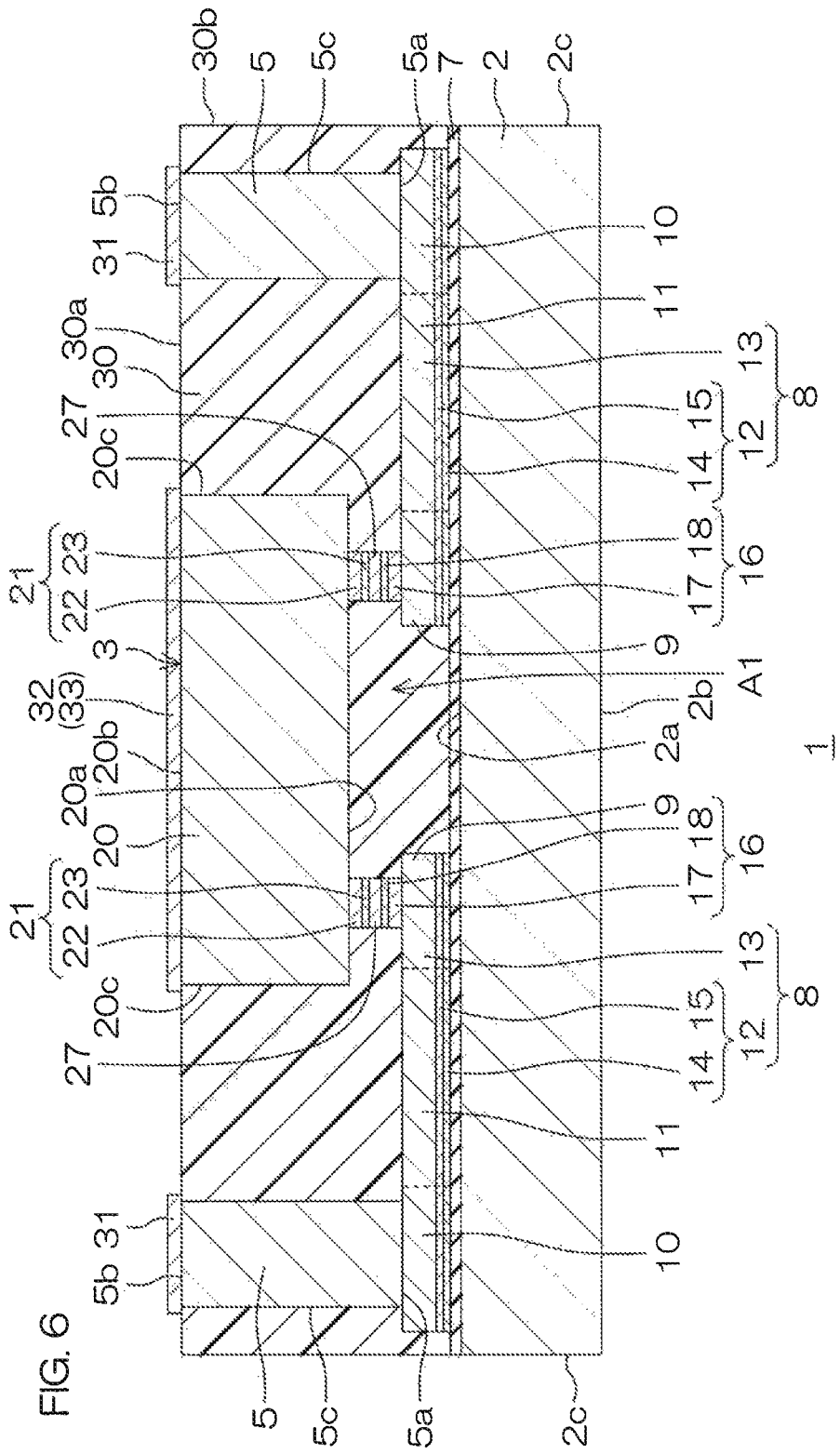
FIG. 6 is a cross-sectional view showing a first modification of the electronic component of FIG. 1.

FIG. 6 is a cross-sectional view showing a first modification of the electronic component 1 of FIG. 1. FIG. 6 is a cross-sectional view of a part corresponding to FIG. 3. In FIG. 6, the same reference sign is given to a constituent equivalent to each constituent shown in FIG. 1 to FIG. 5, and descriptions thereof will be omitted.

The electronic component 1 further includes a heat dissipation member 32, in the present modification. The heat dissipation member 32 is connected to the non-mounting surface 20b of the chip body 20. The heat dissipation member 32 has a thermal conductivity that is higher than a thermal conductivity of the sealing resin 30. The thermal conductivity of the heat dissipation member 32 is higher than a thermal conductivity of the chip body 20.

The heat dissipation member 32 includes a metallic layer 33, in the present modification. The metallic layer 33 has a laminated structure including an Ni layer, a Pd layer, and an Au layer that are laminated in this order from the non mounting surface 20b side of the chip body 20.

The metallic layer 33 is formed by changing the layout of the mask in the step (step S9) of forming the external conductive film 31. The metallic layer 33 may have a single-layer structure including gold (Au), silver (Ag), copper (Cu), or aluminum (Al).

As described above, according to the electronic component 1 in the first modification, the heat dissipation member 32 is connected to the non-mounting surface 20b of the chip body 20. The heat generated at the chip 3 can thus be efficiently transmitted to the heat dissipation member 32 from the non-mounting surface 20b. The rise in temperature of the chip 3 and the rise in temperature of the inside of the sealing resin 30 can thereby be effectively restrained.

Figure 7:
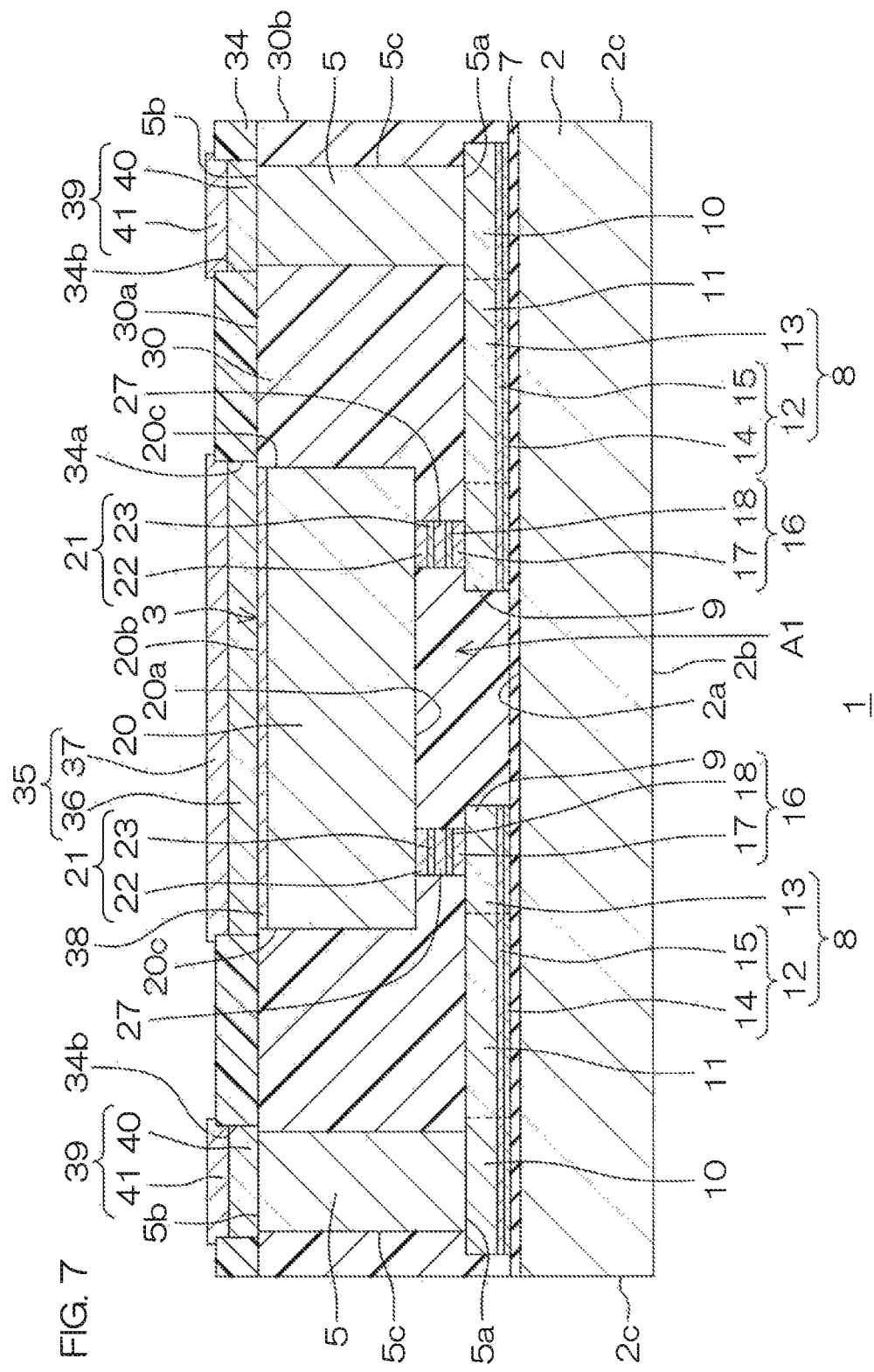
FIG. 7 is a cross-sectional view showing a second modification of the electronic component of FIG. 1.

FIG. 7 is a cross-sectional view showing a second modification of the electronic component 1 of FIG. 1. FIG. 7 is a cross-sectional view of a part corresponding to FIG. 3. In FIG. 7, the same reference sign is given to a constituent equivalent to each constituent shown in FIG. 1 to FIG. 5, and descriptions thereof will be omitted.

The electronic component 1 further includes a surface insulating film 34 covering the sealing principal surface 30a of the sealing resin 30, in the present modification. The surface insulating film 34 may include a nitride film (an SiN film) or an oxide film (an $SiO_2$ film). A first opening 34a and a plurality of second openings 34b are formed in the surface insulating film 34.

The first opening 34a exposes the non-mounting surface 20b of the chip body 20. The first opening 34a may expose substantially the whole region of the non-mounting surface 20b of the chip body 20. Each of the plurality of second openings 34b exposes the opposite end surface 5b of the outer terminal 5. The second opening 34b may expose substantially the whole region of the opposite end surface 5b of the outer terminal 5.

The electronic component 1 further includes a heat dissipation member 35, in the present modification. The heat dissipation member 35 is arranged in the first opening 34a of the surface insulating film 34.

The heat dissipation member 35 is connected to the non-mounting surface 20b of the chip body 20. The heat dissipation member 35 has a thermal conductivity that is higher than a thermal conductivity of the sealing resin 30. The thermal conductivity of the heat dissipation member 35 is higher than a thermal conductivity of the chip body 20. The heat dissipation member 35 has a laminated structure including a first metallic layer 36 and a second metallic layer 37 that are laminated in this order from the non mounting surface 20b side of the chip body 20.

The first metallic layer 36 may have a single-layer structure including gold (Au), silver (Ag), copper (Cu), or aluminum (Al). Preferably, the first metallic layer 36 forms an ohmic contact with the non-mounting surface 20b of the chip body 20. Preferably, the first metallic layer 36 is made of gold (Au).

In the present modification, a heat treatment was performed to the chip 3 and to the first metallic layer 36 at a temperature of, for example, about 400° C. An AuSi eutectic alloy layer 38 is therefore formed in a region between the first metallic layer 36 and the non-mounting surface 20b of the chip body 20. The ohmic contact is formed by the AuSi eutectic alloy layer 38.

In an arrangement in which the heat treatment is performed to the chip 3 and to the first metallic layer 36, the main body portion 17 of the connecting electrode 16 and the main body portion 22 of the terminal electrode 21 are preferably connected directly to each other by the ultrasonic connecting method or a like. According to this arrangement, the conductive bonding material 27 is to be needless, so that a melting of the conductive bonding material 27 at an undesired timing by heat treatment can thus be avoided.

The second metallic layer 37 protrudes more upwardly than the surface of the surface insulating film 34. The second metallic layer 37 may have a laminated structure including an Ni layer, a Pd layer, and an Au layer laminated in this order from the first metallic layer 36 side.

The electronic component 1 further includes a plurality of external conductive films 39, in the present modification. Each of the plurality of external conductive films 39 is formed in the second opening 34b of the surface insulating film 34. The external conductive film 39 includes a first conductive layer 40 and a second conductive layer 41 laminated in this order from the opposite end surface 5b side of the outer terminal 5.

The first conductive layer 40 of the external conductive film 39 is made of the same material as the material of the first metallic layer 36 of the heat dissipation member 35. The first conductive layer 40 of the external conductive film 39 is formed in the same thickness as the thickness of the first metallic layer 36 of the heat dissipation member 35.

The second conductive layer 41 of the external conductive film 39 is made of the same material as the material of the second metallic layer 37 of the heat dissipation member 35. The second conductive layer 41 of the external conductive film 39 is formed in the same thickness as the thickness of the second metallic layer 37 of the heat dissipation member 35.

The electronic component 1 is formed through the following steps instead of the step (step S9) of forming the external conductive film 31, in the present modification.

First, the surface insulating film 34 covering the sealing principal surface 30a of the sealing resin 30 is formed. The surface insulating film 34 may be formed by a CVD method.

Next, the first opening 34a and the second opening 34b are formed in the surface insulating film 34. The first opening 34a and the second opening 34b may be formed by removing unnecessary portions of the surface insulating film 34 by an etching method via a mask.

Next, the heat dissipation member 35 and the external conductive film 39 are formed. First, an Au layer is formed by a sputtering method or an electrolytic plating method. The Au layer is formed on the non-mounting surface 20b of the chip body 20 exposed from the first opening 34a and on the opposite end surface 5b of the outer terminal 5 exposed from the second opening 34b. The first metallic layer 36 of the heat dissipation member 35 and the first conductive layer 40 of the external conductive film 39 are thereby formed.

Next, the heat treatment is performed to the chip 3 and to the first metallic layer 36 at the temperature of, for example, about 400° C. The AuSi eutectic alloy layer 38 is thereby formed at the non-mounting surface 20b of the chip body 20.

Next, the Ni layer, the Pd layer, and the Au layer are laminated in this order by, for example, electrolytic plating methods. The Ni layer, the Pd layer, and the Au layer are formed on the first metallic layer 36 exposed from the first opening 34a and on the first conductive layer 40 exposed from the second opening 34b.

The second metallic layer 37 of the heat dissipation member 35 and the second conductive layer 41 of the external conductive film 39 are thereby formed. The electronic component 1 of the present modification is manufactured through these steps.

As described above, according to the electronic component 1 of the present modification, the heat dissipation member 35 is connected to the non-mounting surface 20b of the chip body 20. The heat generated at the chip 3 can thus be efficiently transmitted to the heat dissipation member 35 from the non-mounting surface 20b. The rise in temperature of the chip 3 and the rise in temperature of the inside of the sealing resin 30 can thereby be effectively restrained.

According to the electronic component 1 of the present modification, the heat dissipation member 35 includes the first metallic layer 36. The first metallic layer 36 forms the ohmic contact with the non-mounting surface 20b of the chip body 20.

Here, a case in which the first metallic layer 36 forms a Schottky junction with the non-mounting surfaces 20b of the chip body 20 shall now be considered. In this case, there is a possibility that the characteristic of the functional element formed at the mounting surface 20a side of the chip body 20 may be changed by a Schottky barrier diode formed at the non-mounting surface 20b side of the chip body 20.

According to the electronic component 1 of the present modification, the ohmic contact is therefore formed at the non-mounting surface 20b of the chip body 20. This ohmic contact is realized by the AuSi eutectic alloy layer 38 formed in the region between the non-mounting surface 20b of the chip body 20 and the first metallic layer 36.

The formation of the Schottky barrier diode at the non-mounting surface 20b of the chip body 20 can thus be effectively restrained. The rise in temperature of the chip 3 can thereby be restrained while enhancing an electric stability of the chip 3.

Figure 8:
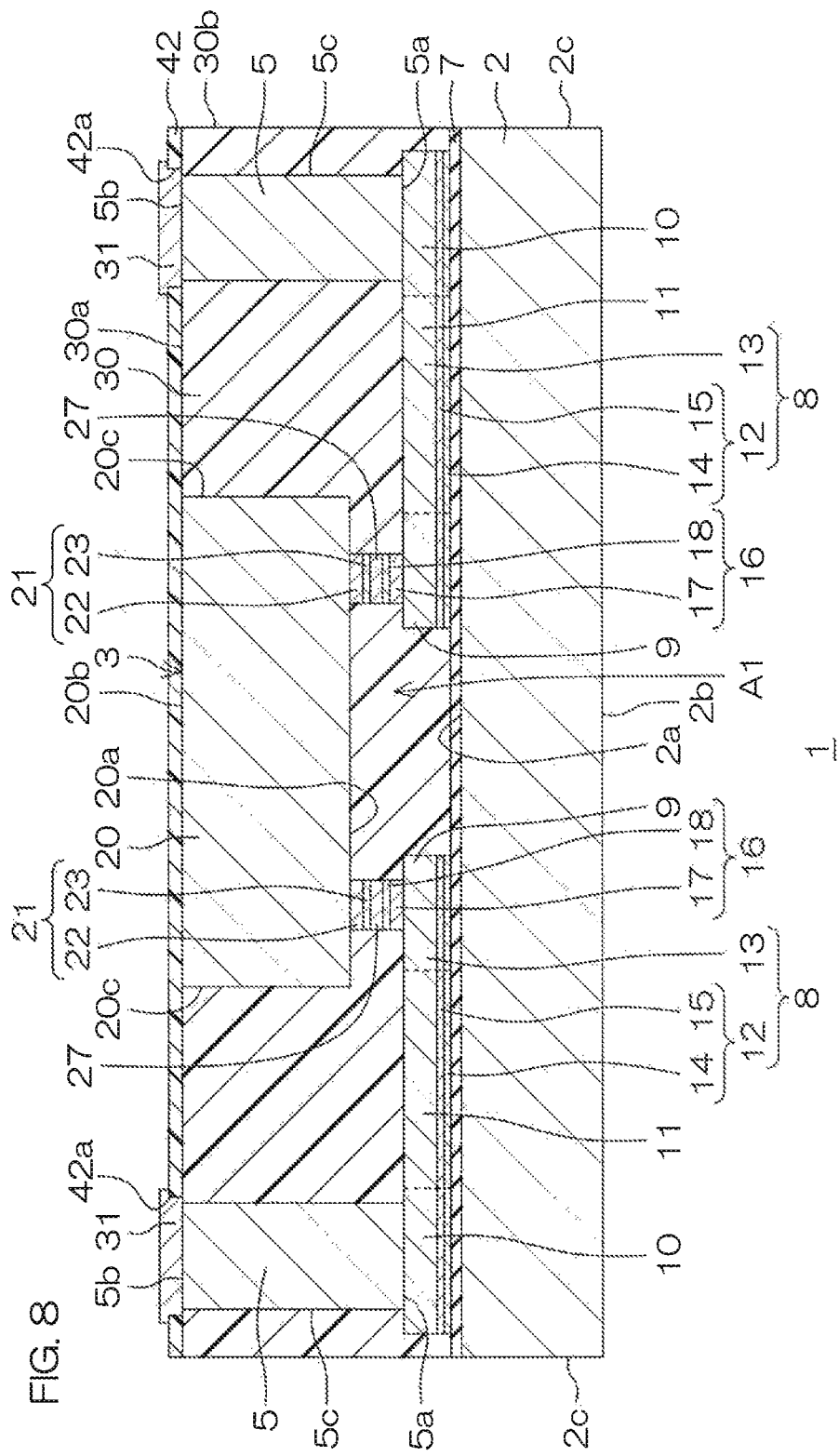
FIG. 8 is a cross-sectional view showing a third modification of the electronic component of FIG. 1.

FIG. 8 is a cross-sectional view showing a third modification of the electronic component 1 of FIG. 2. FIG. 8 is a cross-sectional view of a part corresponding to FIG. 3. In FIG. 8, the same reference sign is given to a constituent equivalent to each constituent shown in FIG. 1 to FIG. 5, and descriptions thereof are omitted.

The electronic component 1 further includes a surface insulating film 42, in the present modification. The surface insulating film 42 covers the non-mounting surface 20b of the chip body 20. A plurality of openings 42a are formed in the surface insulating film 42. Each of the plurality of openings 42a exposes the opposite end surface 5b of the outer terminal 5. The external conductive film 31 (also see FIG. 1 and so on) is arranged in the opening 42a.

The surface insulating film 42 may include an organic insulating material, such as epoxy resin, polyimide resin, or acrylic resin. The surface insulating film 42 may include a negative type photosensitive resin or a positive type photosensitive resin. The surface insulating film 42 may include an inorganic insulating material, such as silicon nitride (SiN) or silicon oxide ($SiO_2$).

The electronic component 1 can be manufactured by forming the surface insulating film 42 that has the openings 42a exposing the opposite end surface 5b of the outer terminal 5, instead of the mask used in the step (step S9) of forming the external conductive film 31, in the present modification.

The electronic component 1 can also be manufactured by using the mask used in the step (step S9) of forming the external conductive film 31 as the surface insulating film 42 as it is, in the present modification.

As described above, according to the electronic component 1 of the present modification, the chip 3 can be protected by the surface insulating film 42. According to the electronic component 1 of the present modification, the non-mounting surface 20b of the chip body 20 is covered with the surface insulating film 42. The effect of restraining the rise in temperature of the chip 3 can thus be small.

However, a market demand that desires achieving a low profile while an arrangement in which the chip 3 is exposed from the sealing resin 30 is not desired can be met.

According to the electronic component 1 of the present modification, the mask used in the step (step S9) of forming the external conductive film 31 can be used as the surface insulating film 42 as it is. The electronic component 1 that has the surface insulating film 42 can thereby be manufactured without consuming much time.

Figure 9:
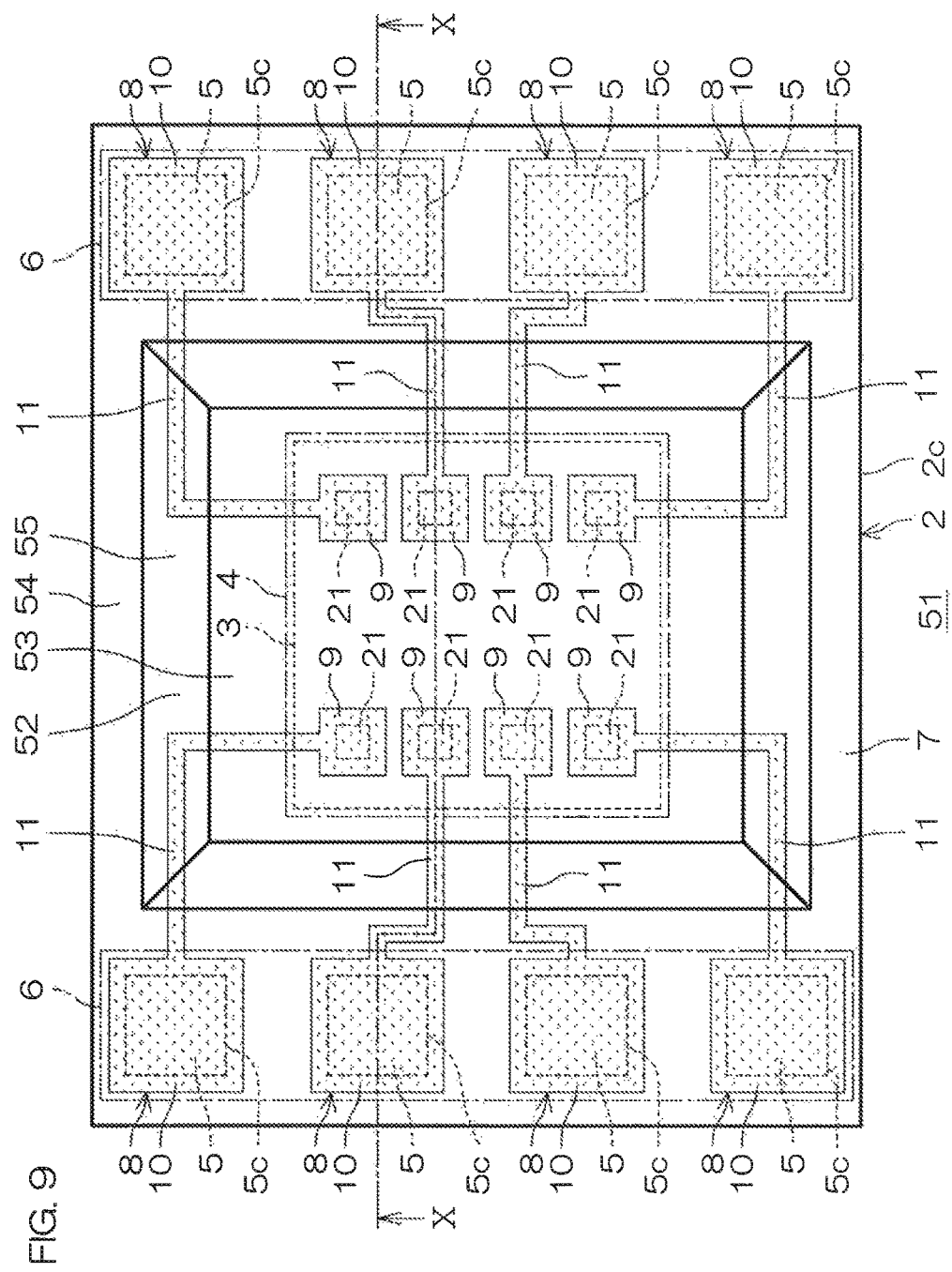
FIG. 9 is a plan view showing an electronic component according to a second preferred embodiment of the present invention.
Figure 10:
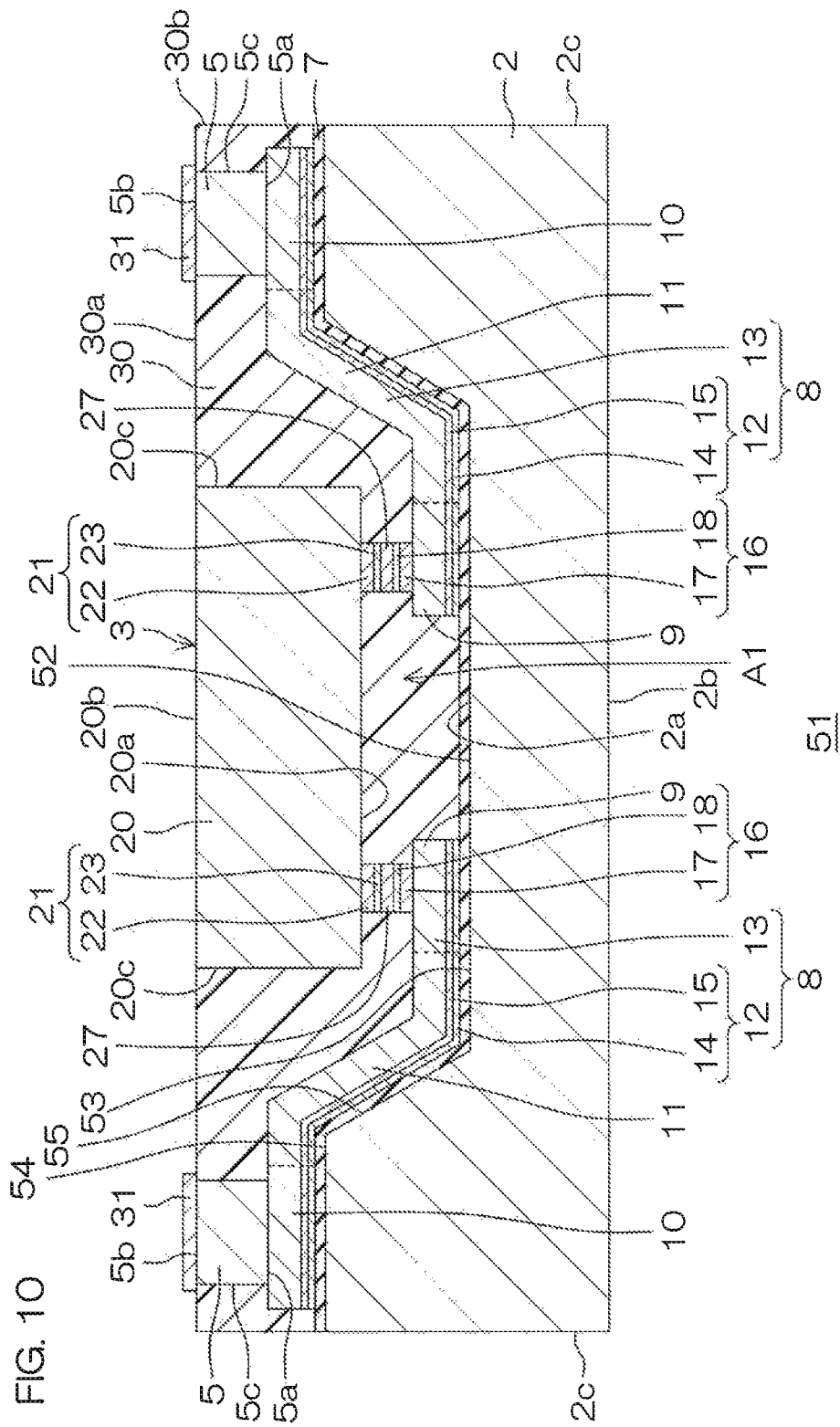
FIG. 10 is a cross-sectional view taken along line X-X of FIG. 9.

FIG. 9 is a plan view showing an electronic component 51 according to a second preferred embodiment of the present invention. FIG. 10 is a cross-sectional view taken along line X-X of FIG. 9.

In FIG. 9 and FIG. 10, the same reference sign is given to a constituent equivalent to each constituent described in the first preferred embodiment, and descriptions thereof will be omitted. For clarity, the plurality of wiring films 8 are depicted by hatching in FIG. 9.

Referring to FIG. 9 and FIG. 10, a recessed portion 52 that is recessed toward the second principal surface 2b is formed at the first principal surface 2a of the interposer 2, in the electronic component 51. The second principal surface 2b of the interposer 2 is formed flatly.

The recessed portion 52 is formed at a central portion of the first principal surface 2a of the interposer 2, in the present preferred embodiment. The recessed portion 52 is formed so as to have an interval inwardly from a peripheral edge of the interposer 2. The recessed portion 52 is formed in a quadrangular shape parallel to each side of the interposer 2 in plan view.

A low region portion 53 that is formed by a bottom of the recessed portion 52, a high region portion 54 that is formed by a region surrounding the recessed portion 52, and a connection portion 55 that connects the low region portion 53 and the high region portion 54 are formed at the first principal surface 2a of the interposer 2. The low region portion 53 is formed in a quadrangular shape parallel to each side of the interposer 2 in plan view. The high region portion 54 is formed in a quadrangular ring shape that surrounds the recessed portion 52 in plan view.

The recessed portion 52 is formed in a tapered shape in which a width of an opening gradually becomes narrower from the high region portion 54 toward the low region portion 53 in a cross-sectional view. The connection portion 55 has an inclined surface that is inclined downwardly from the high region portion 54 toward the low region portion 53. The chip arrangement region 4 is set at the low region portion 53, and the outer terminal arrangement region 6 is set at the high region portion 54.

The chip 3 is accommodated in the recessed portion 52 of the interposer 2. The mounting surface 20a of the chip body 20 is positioned inside the recessed portion 52. On the other hand, the non-mounting surface 20b of the chip body 20 is positioned above the high region portion 54.

The chip 3 is accommodated in the recessed portion 52 at a height at which the high region portion 54 of the interposer 2 is positioned in a region between the mounting surface 20a and the non-mounting surface 20b of the chip body 20.

An area of the mounting surface 20a of the chip body 20 is smaller than an area the low region portion 53 in plan view. A whole area of a peripheral edge of the chip 3 is positioned in a region surrounded by a peripheral edge of the low region portion 53 in plan view. A whole region of the mounting surface 20a of the chip body 20 faces the low region portion 53.

The mounting surface 20a of the chip body 20 may face the low region portion 53 and the connection portion 55. An area of the mounting surface 20a of the chip body 20 may be larger than an area the low region portion 53 in plan view.

The electronic component 51 can be manufactured by preparing the interposer 2 that has the recessed portion 52 in the step of preparing the interposer 2 (see step S1 of FIG. 5). The recessed portion 52 can be formed by selectively digging the first principal surface 2a of the interposer 2 toward the second principal surface 2b, for example, by an etching method through a mask.

As described above, according to the electronic component 51, the chip 3 is accommodated in the recessed portion 52 formed at the first principal surface 2a of the interposer 2. The low profile of the electronic component 51 can thus be achieved by an amount corresponding to the depth of the recessed portion 52 while raising the heat radiation property.

Figure 11:
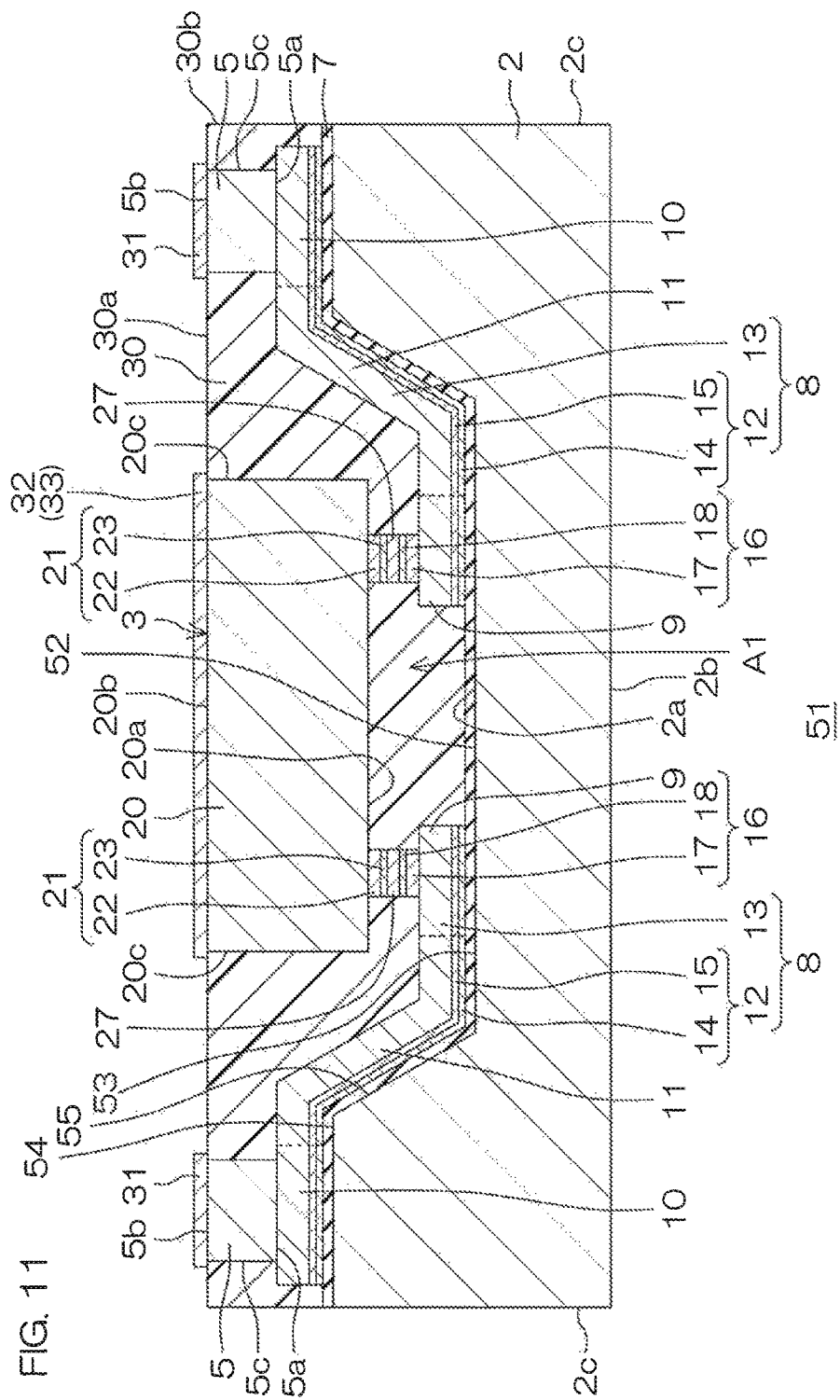
FIG. 11 is a cross-sectional view showing a first modification of the electronic component of FIG. 9.

FIG. 11 is a cross-sectional view showing a first modification of the electronic component 51 of FIG. 9. FIG. 11 is a cross-sectional view of a part corresponding to FIG. 10. In FIG. 11, the same reference sign is given to a constituent equivalent to each constituent described in FIG. 9 and FIG. 10, and descriptions thereof will be omitted.

The electronic component 51 further includes the heat dissipation member 32 (also see FIG. 6), in the present modification. The heat generated at the chip 3 can thus be transmitted from the non-mounting surface 20b to the heat dissipation member 32. The rise in temperature of the chip 3 and the rise in temperature of the inside of the sealing resin 30 can thereby be effectively restrained.

Figure 12:
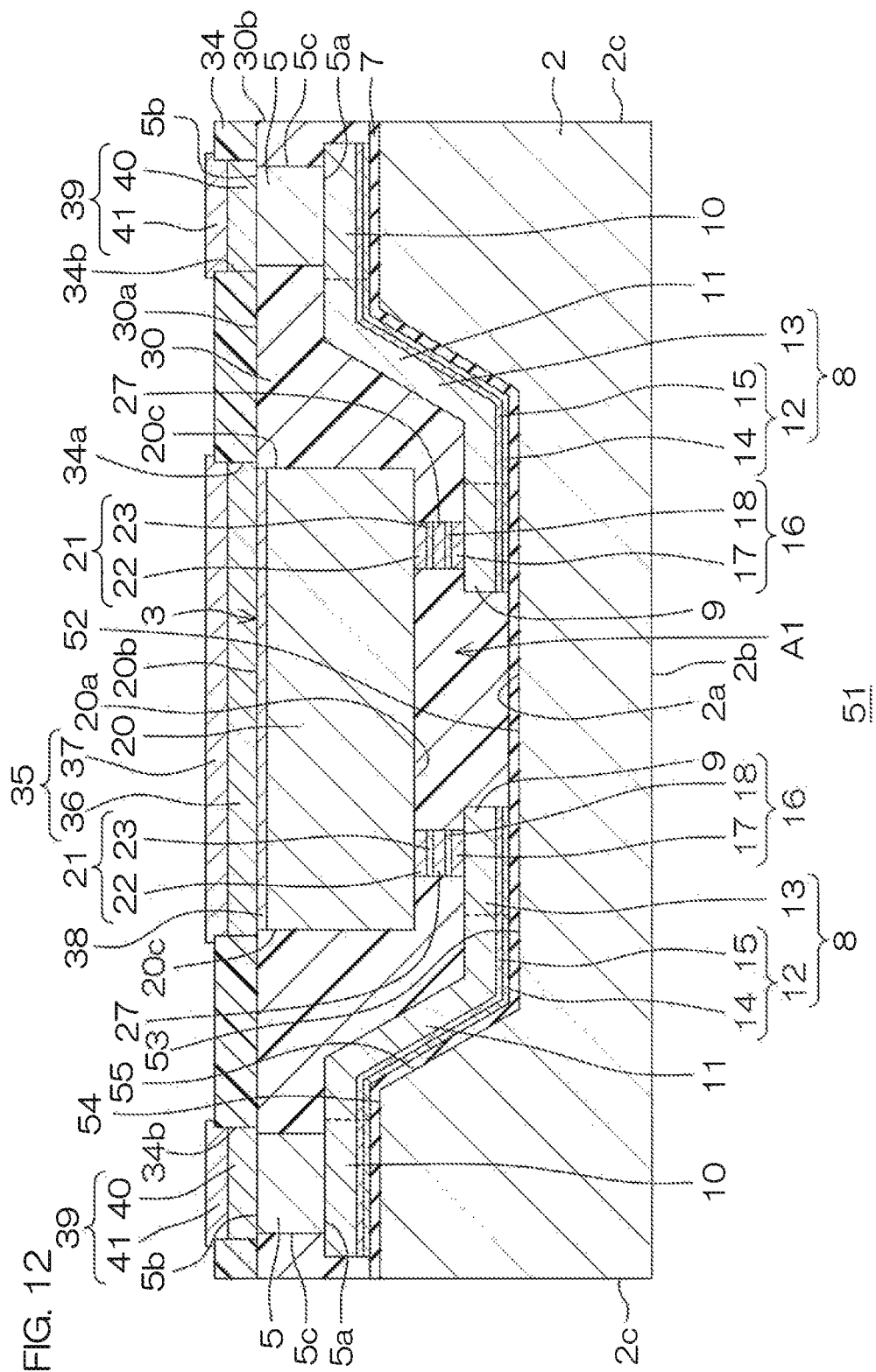
FIG. 12 is a cross-sectional view showing a second modification of the electronic component of FIG. 9.

FIG. 12 is a cross-sectional view showing a second modification of the electronic component 51 of FIG. 9. FIG. 12 is a cross-sectional view of a part corresponding to FIG. 10. In FIG. 12, the same reference sign is given to a constituent equivalent to each constituent described in FIG. 9 and FIG. 10, and descriptions thereof are omitted.

The electronic component 51 further includes the surface insulating film 34, the heat dissipation member 35, and the external conductive film 39 (also see FIG. 7), in the present modification. The heat generated at the chip 3 can thus be efficiently transmitted from the non-mounting surface 20b to the heat dissipation member 35. The rise in temperature of the chip 3 and the rise in temperature of the inside of the sealing resin 30 can thereby be effectively restrained.

According to the electronic component 51 of the present modification, the heat dissipation member 35 includes the first metallic layer 36. The first metallic layer 36 forms the ohmic contact with the non-mounting surface 20b of the chip body 20. This ohmic contact is realized by the AuSi eutectic alloy layer 38 formed in the region between the non-mounting surface 20b of the chip body 20 and the first metallic layer 36.

The formation of the Schottky barrier diode at the non-mounting surface 20b of the chip body 20 can thus be effectively restrained. The rise in temperature of the chip 3 can thereby be restrained while enhancing an electric stability of the chip 3.

Figure 13:
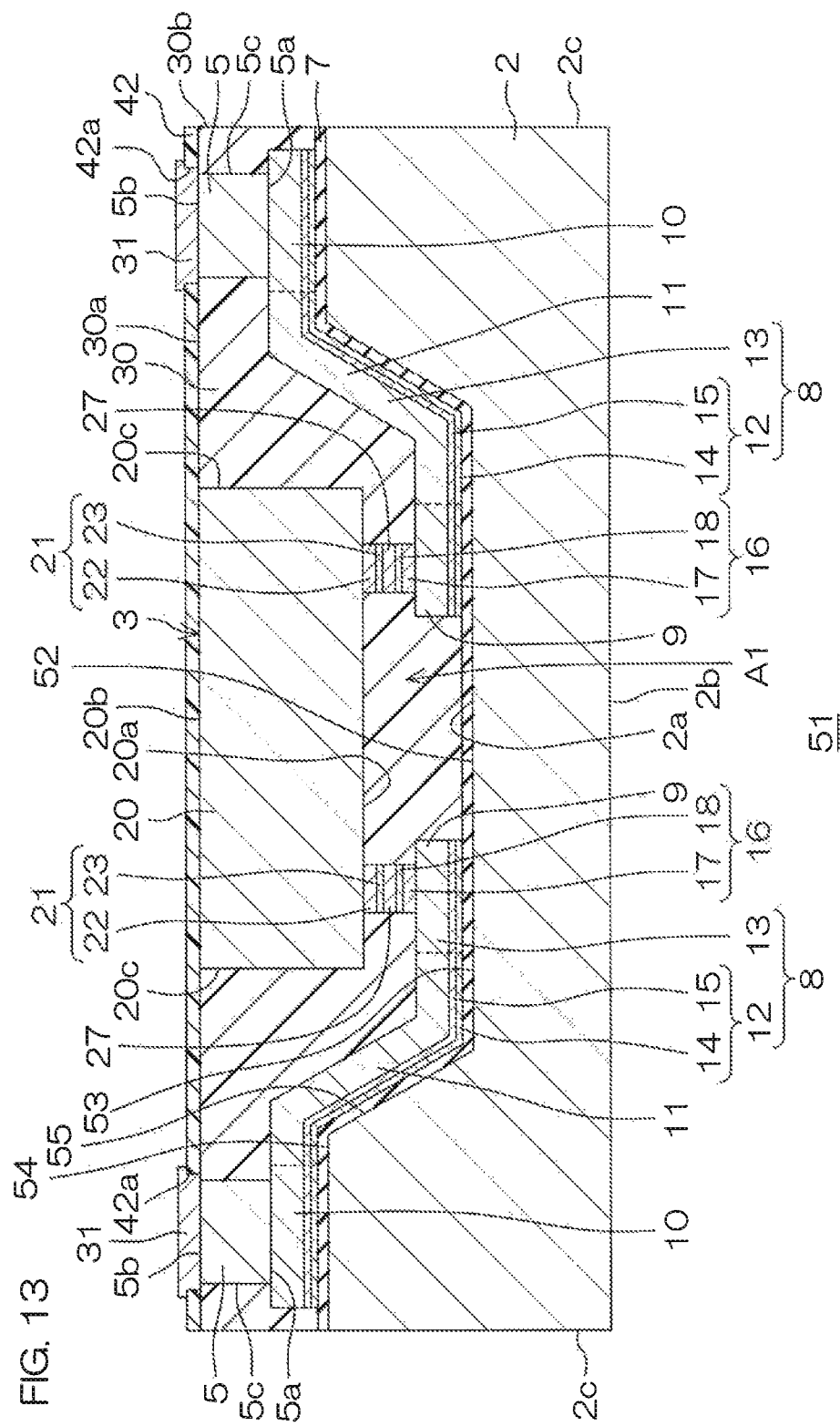
FIG. 13 is a cross-sectional view showing a third modification of the electronic component of FIG. 9.

FIG. 13 is a cross-sectional view showing a third modification of the electronic component 51 of FIG. 9. FIG. 13 is a cross-sectional view of a part corresponding to FIG. 10. In FIG. 12, the same reference sign is given to a constituent equivalent to each constituent described in FIG. 9 and FIG. 10, and descriptions thereof are omitted.

The electronic component 51 further includes the surface insulating film 42 (also see FIG. 8), in the present modification. A whole region of the non-mounting surface 20b of the chip body 20 is coated covered with the surface insulating film 42. The chip 3 can thereby be protected by the surface insulating film 42.

According to the electronic component 51 of the present modification, the non-mounting surface 20b of the chip body 20 is covered with the surface insulating film 42. The effect of restraining the rise in temperature of the chip 3 can thus be small.

However, a market demand that desires achieving the low profile while an arrangement in which the chip 3 is exposed from the sealing resin 30 is not desired can be met.

According to the electronic component 51 of the present modification, the mask in the step (step S9) of forming the external conductive film 31 can be used as the surface insulating film 42 as it is. The electronic component 51 that has the surface insulating film 42 can thereby be manufactured without consuming much time.

Figure 14:
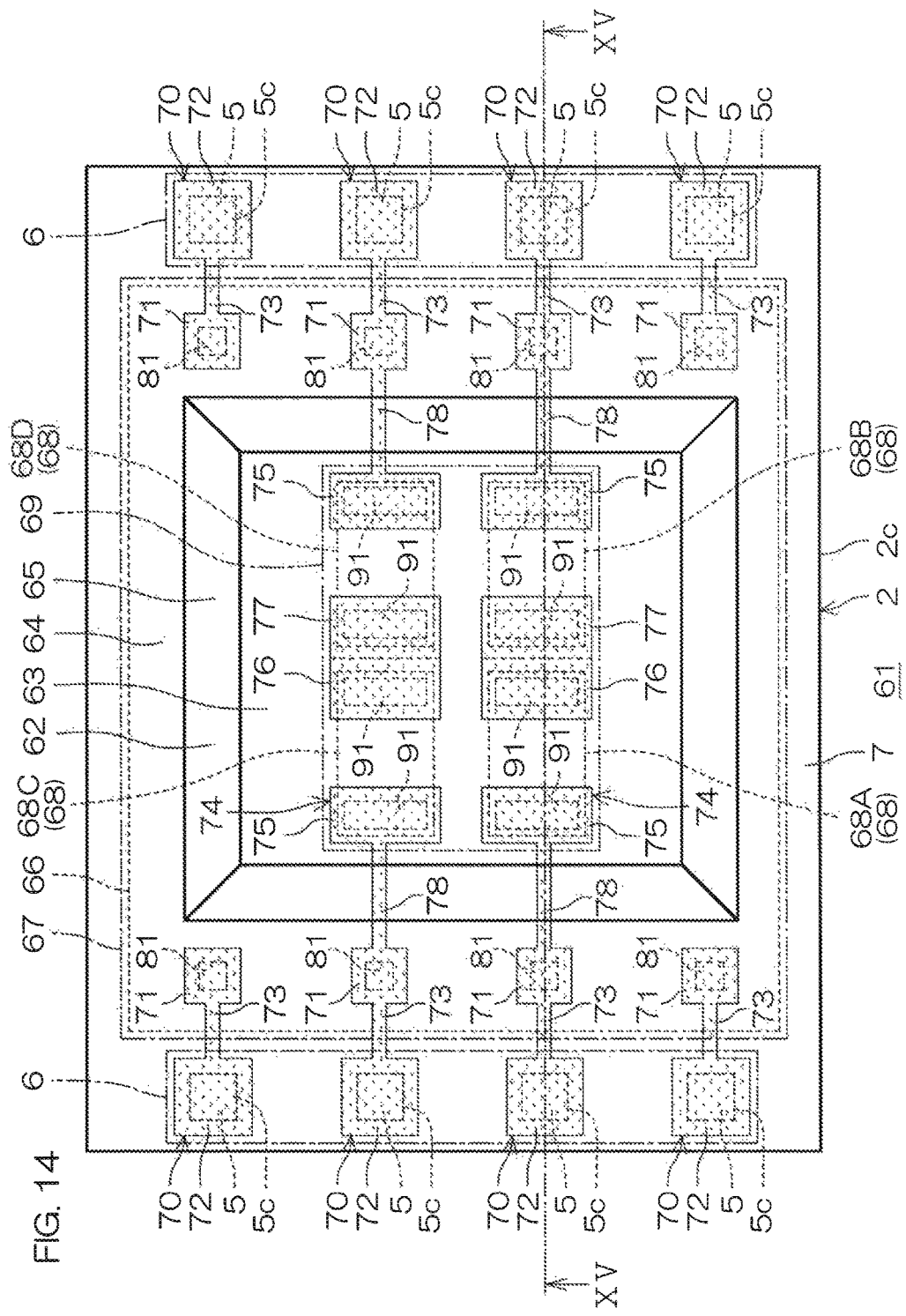
FIG. 14 is a plan view showing an electronic component according to a third preferred embodiment of the present invention.
Figure 15:
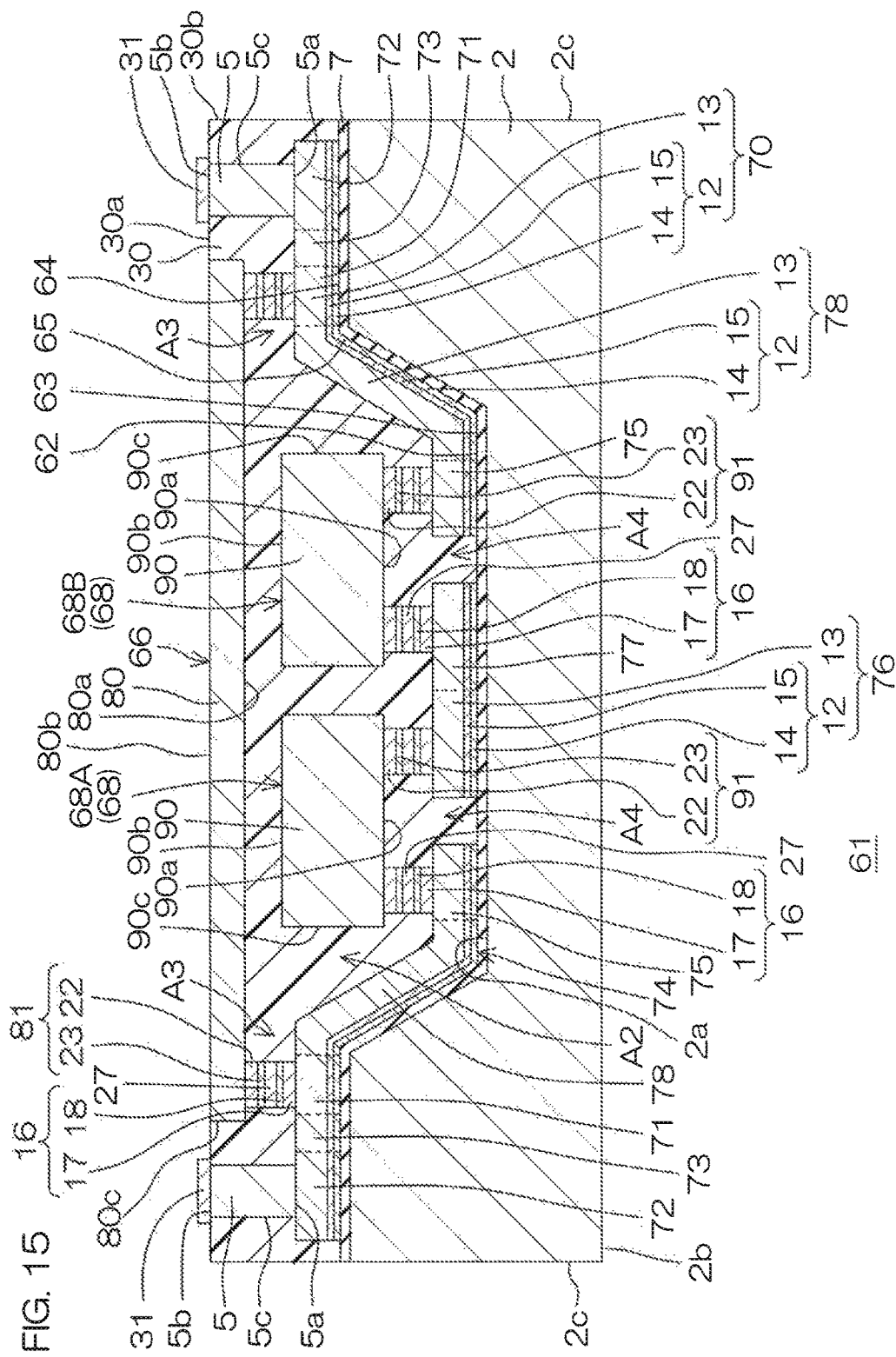
FIG. 15 is a cross-sectional view taken along line XV-XV of FIG. 14.

FIG. 14 is a plan view showing an electronic component 61 according to a third preferred embodiment of the present invention. FIG. 15 is a cross-sectional view taken along line XV-XV of FIG. 14. In FIG. 14 and FIG. 15, the same reference sign is given to a constituent equivalent to each constituent described in the first preferred embodiment, and descriptions thereof will be omitted.

Referring to FIG. 14 and FIG. 15, a recessed portion 62 that is recessed toward the second principal surface 2b is formed at the first principal surface 2a of the interposer 2, in the electronic component 61. The second principal surface 2b of the interposer 2 is formed flatly.

The recessed portion 62 is formed at a central portion of the first principal surface 2a of the interposer 2, in the present preferred embodiment. The recessed portion 62 is formed so as to have an interval inwardly from the peripheral edge of the interposer 2. The recessed portion 62 is formed in a quadrangular shape parallel to each side of the interposer 2 in plan view.

A low region portion 63 that is formed by a bottom of the recessed portion 62, a high region portion 64 that is formed by a region surrounding the recessed portion 62, and a connection portion 65 that connects the low region portion 63 and the high region portion 64 are formed at the first principal surface 2a of the interposer 2. The low region portion 63 is formed in a quadrangular shape parallel to each side of the interposer 2 in plan view. The high region portion 64 is formed in a quadrangular ring shape that surrounds the recessed portion 62 in plan view.

The recessed portion 62 is formed in a tapered shape in which a width of an opening gradually becomes narrower from the high region portion 64 toward the low region portion 63 in a cross-sectional view. The connection portion 65 has an inclined surface that is inclined downwardly from the high region portion 64 toward the low region portion 63.

A first chip arrangement region 67 and a second chip arrangement region 69 are set at the first principal surface 2a of the interposer 2. The first chip arrangement region 67 is set at the high region portion 64 of the interposer 2, and the second chip arrangement region 69 is set at the low region portion 63 of the interposer 2.

The first chip arrangement region 67 is a region in which the first chip 66 is arranged. The first chip arrangement region 67 is set so as to surround the recessed portion 62 in a region between the peripheral edge of the interposer 2 and the peripheral edge of the recessed portion 62. The first chip arrangement region 67 is set in a quadrangular shape parallel to each side of the interposer 2 in plan view.

The second chip arrangement region 69 is a region in which the second chip 68 is arranged. The second chip arrangement region 69 is set in a region surrounded by a peripheral edge of the low region portion 63 in plan view. The second chip arrangement region 69 is set in a quadrangular shape parallel to each side of the interposer 2 in plan view.

The outer terminal arrangement region 6 is set in a region between the one short-side surface 2c of the interposer 2 and the first chip arrangement region 67. The outer terminal arrangement region 6 is also set in a region between the other short-side surface 2c of the interposer 2 and the first chip arrangement region 67.

The insulating film 7 is formed on the first principal surface 2a of the interposer 2. A plurality of first wiring films 70 (in the present preferred embodiment, eight first wiring films) are formed on the insulating film 7 in the high region portion 64 of the interposer 2. For clarity, the plurality of first wiring films 70 are depicted by hatching in FIG. 14.

Each of the plurality of first wiring films 70 includes a first pad region 71, a second pad region 72, and a connection region 73. The first pad region 71 is arranged in the first chip arrangement region 67. The second pad region 72 is arranged in the outer terminal arrangement region 6. The connection region 73 connects the first pad region 71 and the second pad region 72.

Four first pad regions 71 are arranged in a region at the one short-side surface 2c side of the interposer 2 in the first chip arrangement region 67. These four first pad regions 71 are arranged at intervals along the short-side lateral direction of the interposer 2.

Four first pad regions 71 are arranged in a region at the other short-side surface 2c side of the interposer 2 in the first chip arrangement region 67. These four first pad regions 71 are arranged at intervals along the short-side lateral direction of the interposer 2. Each first pad region 71 may be formed in a quadrangular shape in plan view.

Four second pad regions 72 are arranged in the outer terminal arrangement region 6 at the one short-side surface 2c side of the interposer 2. These four second pad regions 72 are arranged at intervals along the short-side lateral direction of the interposer 2.

Four second pad regions 72 are arranged in the outer terminal arrangement region 6 at the other short-side surface 2c side of the interposer 2. These four second pad regions 72 are arranged at intervals along the short-side lateral direction of the interposer 2. Each second pad region 72 may be formed in a quadrangular shape in plan view.

The connection region 73 is connected to the corresponding first pad region 71 and to the corresponding second pad region 72. The connection region 73 is selectively laid around in a region between the corresponding first pad region 71 and the corresponding second pad region 72.

A plurality of second wiring films 74 (in the present preferred embodiment, two second wiring films) are formed on the insulating film 7 in the low region portion 63 of the interposer 2. The plurality of second wiring films 74 (in the present preferred embodiment, two second wiring films) are arranged at intervals along the short-side lateral direction of the interposer 2. For clarity, the plurality of second wiring films 74 are depicted by hatching in FIG. 14.

Each of the plurality of second wiring films 74 includes a pair of third pad regions 75, a fourth pad region 76, and a fifth pad region 77. The pair of third pad regions 75 are arranged at intervals along a long-side longitudinal direction of the interposer 2.

The fourth pad region 76 and the fifth pad region 77 are arranged in a region between the pair of third pad regions 75. The fourth pad region 76 and the fifth pad region 77 are formed integrally with each other in the present preferred embodiment.

A plurality of connecting wiring films 78 (in the present preferred embodiment, four connecting wiring films) are further formed on the insulating film 7. Each connecting wiring film 78 connects the corresponding first wiring film 70 and the corresponding second wiring film 74. More specifically, the connecting wiring film 78 connects the first pad region 71 of the corresponding first wiring film 70 and the third pad region 75 of the corresponding second wiring film 74.

The first wiring film 70, the second wiring film 74, and the connecting wiring film 78 each have a laminated structure including the seed layer 12 and the conductive layer 13. The connecting electrode 16 is formed on each upper surface of the first pad regions 71, the third pad regions 75, the fourth pad regions 76, and the fifth pad regions 77 excluding the upper surfaces of the second pad regions 72.

The first chip 66 is arranged in the first chip arrangement region 67. The first chip 66 includes a first chip body 80. The first chip body 80 is formed in a rectangular parallelepiped shape. The first chip body 80 may be made of silicon, GaAs, or an insulating material. The insulating material may include glass or ceramic.

The first chip body 80 has a first mounting surface 80a, a first non-mounting surface 80b positioned on a side opposite to the first mounting surface 80a, and a first side surfaces 80c that connect the first mounting surface 80a and the first non-mounting surface 80b. The first mounting surface 80a is a facing surface that faces the interposer 2 when the first chip 66 is mounted on the interposer 2.

The first mounting surface 80a of the first chip body 80 may be a functional element forming surface on which a functional element is formed. The functional element may include at least one of a resistor, a capacitor, a coil, a diode, or a transistor. The first chip 66 may be a chip including a monofunctional element, or may be a chip that includes an integrated circuit having a plurality of functional elements.

A plurality of first terminal electrodes 81 are formed on the first mounting surface 80a of the first chip body 80. The plurality of first terminal electrodes 81 are electrically connected to the functional element. The first terminal electrode 81 has a laminated structure including the main body portion 22 and the barrier layer 23.

An insulating layer may be formed on the first mounting surface 80a of the first chip body 80. In this case, the plurality of first terminal electrodes 81 may protrude outwardly from the insulating layer. A wiring layer that includes wires that electrically connect the plurality of first terminal electrodes 81 and the functional element may be selectively formed at the insulating layer.

The first chip 66 is arranged at the first principal surface 2a of the interposer 2 in a posture in which the first mounting surface 80a of the first chip body 80 faces the first principal surface 2a of the interposer 2. Each of the plurality of first terminal electrodes 81 is connected to the corresponding first wiring film 70 via the connecting electrode 16.

The first chip 66 is thus electrically connected to the plurality of first wiring films 70. The first terminal electrode 81 may be connected to the connecting electrode 16 via the conductive bonding material 27. The main body portion 17 of the connecting electrode 16 and the main body portion 22 of the first terminal electrode 81 may be directly connected to each other by a known ultrasonic connecting method.

As thus described, the first chip 66 is bridged over the high region portion 64 so as to cover the recessed portion 62 of the interposer 2. A recessed space A2 is thereby defined in a region between the first mounting surface 80a of the first chip body 80 and the low region portion 63 of the interposer 2.

A plurality of second chips 68 (in the present preferred embodiment, four second chips) as one example of lower side chips are arranged in the recessed space A2. The plurality of second chips 68 are arranged in the second chip arrangement region 69. The four second chips 68 are hereinafter referred to as a second chip 68A, a second chip 68B, a second chip 68C, and a second chip 68D.

All of the second chips 68A to 68D are accommodated in the recessed space A2. All of the second chips 68A to 68D are overlapped by the first chip 66 in plan view.

The second chips 68A to 68D each include a second chip body 90. The second chip body 90 is formed in a rectangular parallelepiped shape. The second chip body 90 may be made of silicon, GaAs, or an insulating material. The insulating material may include glass or ceramic.

The second chip body 90 has a second mounting surface 90a, a second non-mounting surface 90b positioned on a side opposite to the second mounting surface 90a, and second side surfaces 90c that connects the second mounting surface 90a and the second non-mounting surface 90b. The second mounting surface 90a is a facing surface that faces the interposer 2 when the second chips 68A to 68D are mounted on the interposer 2.

The second mounting surface 90a of the second chip body 90 may be a functional element forming surface on which a functional element is formed. The functional element may include at least one of a resistor, a capacitor, a coil, a diode, or a transistor. The second chips 68A to 68D may be chips each of which includes a monofunctional element, or may be chips each of which includes an integrated circuit having a plurality of functional elements.

A plurality of second terminal electrodes 91 are formed on the second mounting surface 90a of the second chip body 90. Each of the plurality of second terminal electrodes 91 is electrically connected to the functional element. The second terminal electrode 91 has a laminated structure including the main body portion 22 and the barrier layer 23.

An insulating layer may be formed on the second mounting surface 90a of the second chip body 90. In this case, the plurality of second terminal electrodes 91 may protrude outwardly from the insulating layer. A wiring layer that includes wires that electrically connect the plurality of second terminal electrodes 91 and the functional element may be selectively formed at the insulating layer.

In each of the second chips 68A to 68D, the second mounting surface 90a and the second non-mounting surface 90b of the second chip body 90 are positioned inside the recessed portion 62. In each of the second chips 68A to 68D, the second non-mounting surface 90b of the second chip body 90 is positioned below the high region portion 64 of the interposer 2.

The second chips 68A to 68D are arranged at the first principal surface 2a of the interposer 2 in a posture in which the second non-mounting surface 90b of the second chip body 90 faces the first principal surface 2a of the interposer 2. In the second chips 68A to 68D, each second terminal electrode 91 is connected to the corresponding second wiring film 74 via the connecting electrode 16.

The second chips 68A to 68D are thus electrically connected to corresponding second wiring films 74, respectively. The second terminal electrode 91 may be connected to the connecting electrode 16 via the conductive bonding material 27. The main body portion 17 of the connecting electrode 16 and the main body portion 22 of the second terminal electrode 91 may be directly connected to each other by a known ultrasonic connecting method.

Referring to FIG. 14, the second chip 68A and the second chip 68B are connected in series in one second wiring film 74. In the one second wiring film 74, the second chip 68A is connected to one third pad region 75 and to one fourth pad region 76. The second chip 68B is connected to one other third pad region 75 and to one other fourth pad region 76.

Referring to FIG. 14, the second chip 68C and the second chip 68D are connected in series in one other second wiring film 74. In the one other second wiring film 74, the second chip 68C is connected to one third pad region 75 and to one fourth pad region 76. The second chip 68D is connected to one other third pad region 75 and to one other fourth pad region 76.

As thus described, a first series circuit including the second chips 68A and 68B and a second series circuit including the second chips 68C and 68D are formed in the recessed space A2 (recessed portion 62). Each of the first and second series circuits is connected in parallel to the first chip 66.

An arrangement in which a parallel circuit including at least one of the second chips 68A, 68B, 68C, or 68D is connected in parallel to the first chip 66 may be adopted. This arrangement is realized by changing the form of the pair of third pad regions 75, the fourth pad region 76, and the fifth pad region 77 in the second wiring film 74.

A circuit network formed by various forms including at least one of the second chips 68A, 68B, 68C, or 68D may be formed in the recessed space A2 (recessed portion 62).

This circuit network may include a series circuit including at least one of the second chips 68A, 68B, 68C, or 68D. This circuit network may include a parallel circuit including at least one of the second chips 68A, 68B, 68C, or 68D. This circuit network may include a series circuit including at least one of the second chips 68A, 68B, 68C, or 68D and a parallel circuit including at least one of the second chips 68A, 68B, 68C, or 68D.

The outer terminal 5 is formed on each of the plurality of second pad regions 72, in the outer terminal arrangement region 6. The sealing resin 30 is formed on the first principal surface 2a of the interposer 2.

The sealing resin 30 seals the first chip 66 so as to expose a whole region of the first non-mounting surface 80b of the first chip body 80. The sealing resin 30 fills a whole region of the recessed space A2, and covers a whole region of the first side surfaces 80c of the first chip body 80. Furthermore, the sealing resin 30 seals each outer terminal 5 so as to expose the whole region of the opposite end surface 5b of each outer terminal 5.

The first non-mounting surface 80b of the first chip body 80, the opposite end surface 5b of each outer terminal 5, and the sealing principal surface 30a of the sealing resin 30 are connected without differences in level. The first non-mounting surface 80b of the first chip body 80, the opposite end surface 5b of each outer terminal 5, and the sealing principal surface 30a of the sealing resin 30 form a single flat surface. This single flat surface is formed in parallel with the second principal surface 2b of the interposer 2.

As described above, according to the electronic component 61, the first non-mounting surface 80b of the first chip 66 is exposed from the sealing resin 30. The heat generated at the first chip 66 can thus be dissipated to outside via the first non-mounting surface 80b. A rise in temperature of the first chip 66 and a rise in temperature of the inside of the sealing resin 30 can thereby be restrained. A rise in temperature of the second chips 68A to 68D can also be restrained by the heat dissipation via the first chip 66.

Particularly, in the electronic component 61, the whole region of the first non-mounting surface 80b of the first chip body 80 is exposed from the sealing resin 30. The heat generated at the first chip 66 can thus be dissipated to outside via the whole region of the first non-mounting surface 80b. The rise in temperature of the first chip 66 and the rise in temperature of the second chips 68A to 68D can thereby be effectively restrained. The electronic component 61 being excellent in reliability can thereby be provided.

According to the electronic component 61, the first chip 66 is arranged in a layered state above the second chips 68A to 68D in the normal direction of the first principal surface 2a of the interposer 2. The electronic component 61 can thus be provided as a multifunctional element-type electronic component.

According to the laminated structure described above, the first chip 66 and the second chips 68A to 68D are not required to be arranged along the first principal surface 2a of the interposer 2. A size of the electronic component 61 can thereby be three-dimensionally reduced.

According to the laminated structure described above, the circuit network including the first chip 66 and the second chips 68A to 68D can be three-dimensionally mounted (3D mounted) on the mounting board through a single step in which the electronic component 61 is mounted on the mounting substrate.

The circuit network including the first chip 66 and the second chips 68A to 68D can thereby be mounted on the mounting substrate without consuming much time. The occupied area of the circuit network including the first chip 66 and the second chips 68A to 68D with respect to the mounting substrate can thereby be reduced. The circuit network including the first chip 66 and the second chips 68A to 68D can thus be high-densely mounted on the mounting substrate. Therefore, the mounting board can also be miniaturized.

According to the electronic component 61, a space A3 is formed in a region between the first mounting surface 80a of the first chip body 80 and the high region portion 64 of the interposer 2 by the plurality of connecting electrodes 16. This space A3 is set to a height enough to fill the sealing resin 30.

The sealing resin 30 can thus be appropriately supplied to a region inside the recessed portion 62 of the interposer 2 and to a region outside the recessed portion 62. The sealing resin 30 can thereby be satisfactorily filled in a region between the first mounting surface 80*a* of the first chip body 80 and the high region portion 64 of the interposer 2 by the space A3. A formation of a void (empty hole) in the sealing resin 30 that is filled into the space A3 can thus be restrained.

A whole region of each outer surface of the first terminal electrode 81, the connecting electrode 16, and the conductive bonding material 27 can thus be coated with the sealing resin 30. Corrosion of the first terminal electrode 81, the connecting electrode 16, and the Conductive bonding material 27 by moisture to be stored in the void (empty hole) can thereby be restrained.

A space A4 is formed in a region between the second mounting surface 90*a* of the second chip body 90 and the first principal surface 2*a* of the interposer 2 by the plurality of connecting electrodes 16 in the recessed space A2. This space A4 is set to a height enough to fill the sealing resin 30.

The sealing resin 30 can thus be satisfactorily filled in a region between the second mounting surface 90*a* of the second chip body 90 and the first principal surface 2*a* of the interposer 2 by the space A4. A formation of a void (empty hole) in the sealing resin 30 that is filled into the space A4 can thus be restrained.

A whole region of each outer surface of the second terminal electrode 91, the connecting electrode 16, and the Conductive bonding material 27 can thus be coated with the sealing resin 30. Corrosion of the second terminal electrode 91, the connecting electrode 16, and the Conductive bonding material 27 by moisture to be stored in the void (empty hole) can thereby be restrained.

The electronic component 61 of the present modification can be manufactured by changing the step shown in FIG. 5 as follows.

In a step of preparing the interposer 2 (step S1), the interposer 2 that has the recessed portion 62 is prepared. The recessed portion 62 of the interposer 2 can be formed by selectively digging the first principal surface 2*a* of the interposer 2 toward the second-principal-surface-2*b* side, for example, by an etching method via a mask.

In a wiring-film forming step (step S3), the first wiring film 70, the second wiring film 74, and the connecting wiring film 78 are formed instead of the wiring film 8. It is possible to form the first wiring film 70, the second wiring film 74, and the connecting wiring film 78 by changing the layout and the like of the mask for the wiring film 8.

In a chip mount step (step S6), the second chips 68A to 68D are connected to the second wiring film 74. Thereafter, the first chip 66 is connected to the first wiring film 70. The electronic component 61 is manufactured through those steps.

Figure 16:
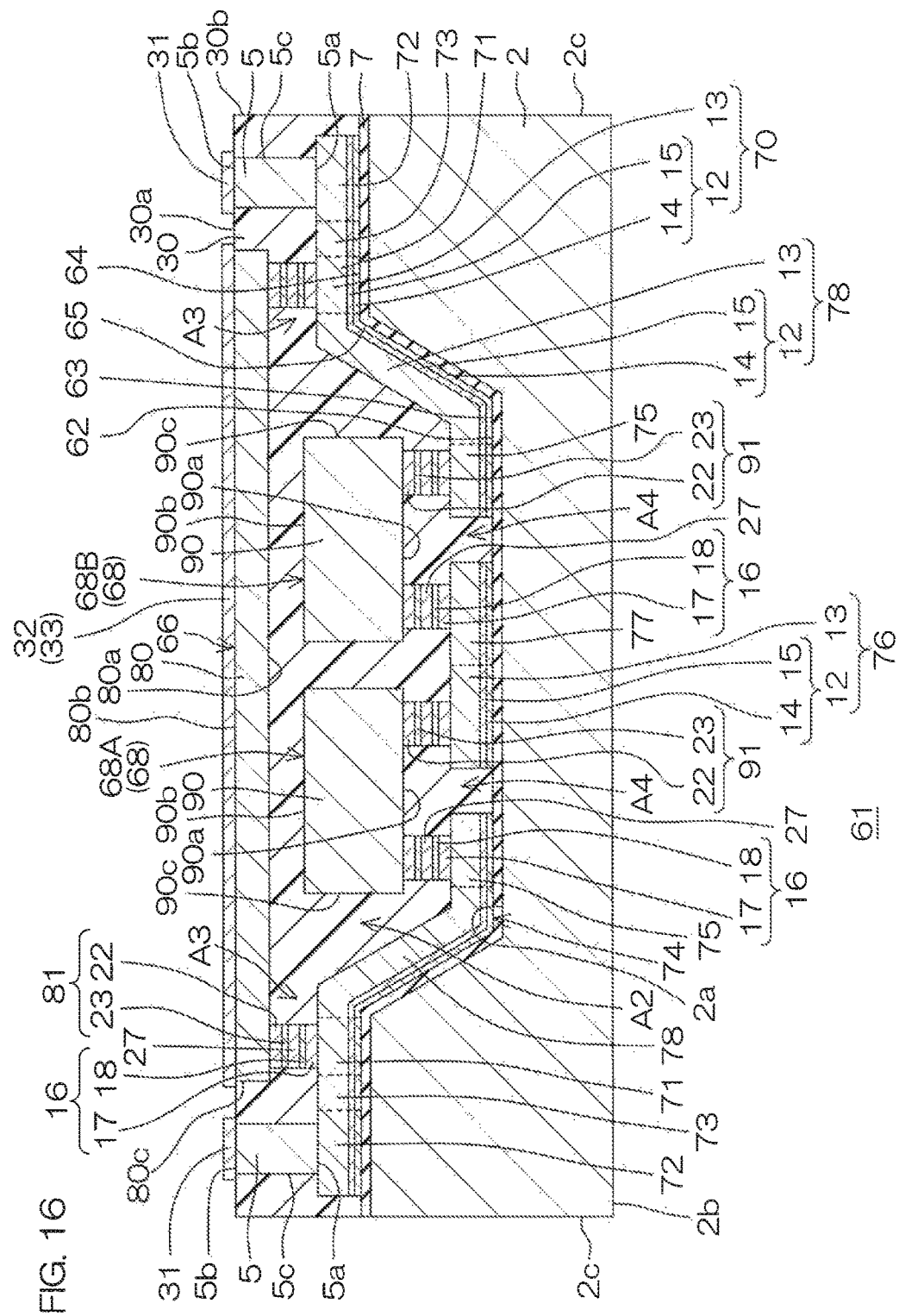
FIG. 16 is a cross-sectional view showing a first modification of the electronic component of FIG. 14.

FIG. 16 is a cross-sectional view showing a first modification of the electronic component 61 of FIG. 14. In FIG. 16, the same reference sign is given to a constituent equivalent to each constituent described in FIG. 14 and FIG. 15, and descriptions thereof will be omitted.

The electronic component 61 further includes the heat dissipation member 32 (also see FIG. 6), in the present modification. The heat dissipation member 32 is connected to a whole region of the first non-mounting surface 80*b* of the first chip body 80.

The heat generated at the first chip 66 can thus be transmitted from the non-mounting surface 20*b* to the heat dissipation member 35. The rise in temperature of the first chip 66 and the rise in temperature of the inside of the sealing resin 30 can thereby be effectively restrained. The rise in temperature of the second chips 68A to 68D can also be effectively restrained.

Figure 17:
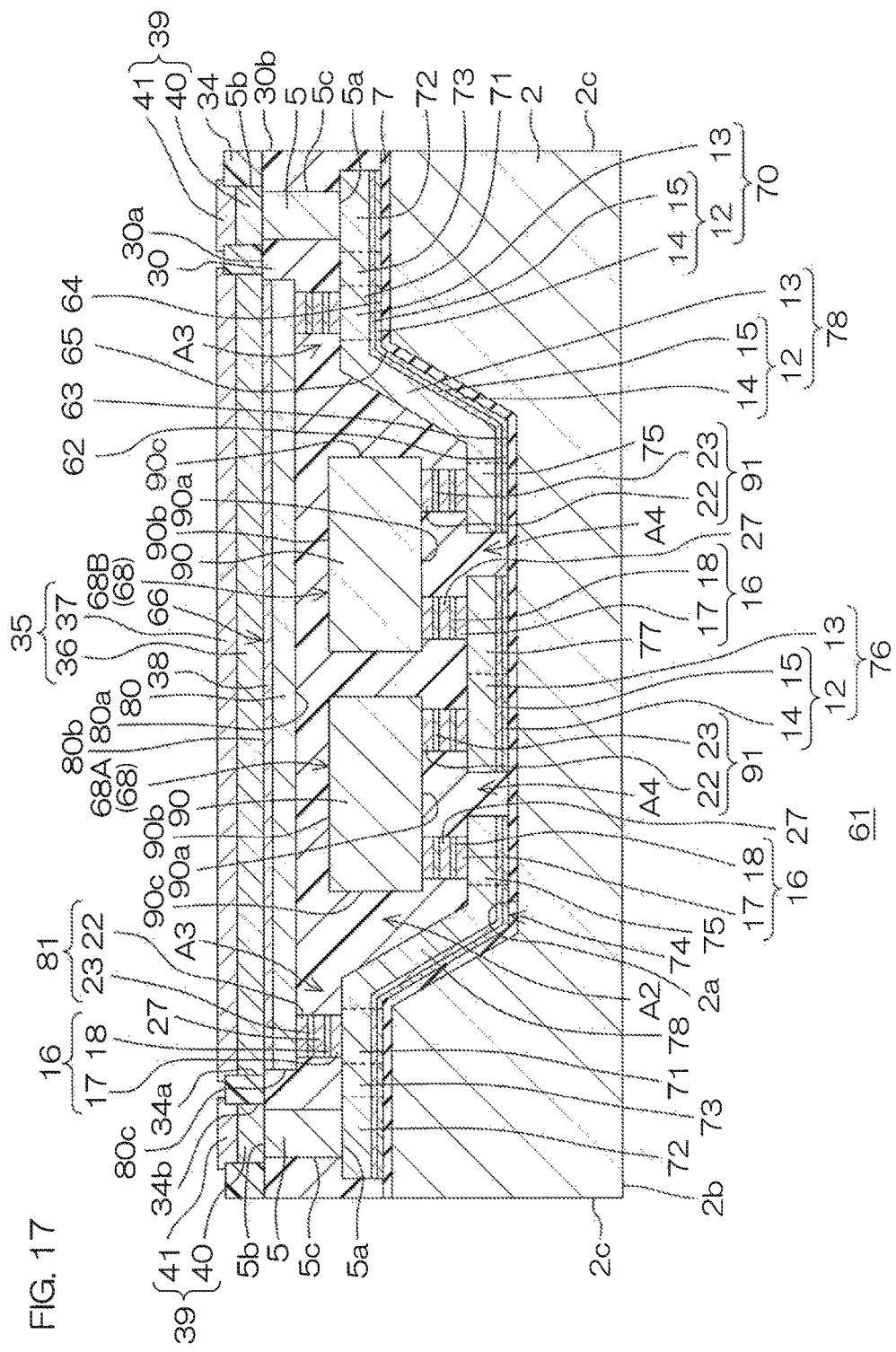
FIG. 17 is a cross-sectional view showing a second modification of the electronic component of FIG. 14.

FIG. 17 is a cross-sectional view showing a second modification of the electronic component 61 of FIG. 14. In FIG. 17, the same reference sign is given to a constituent equivalent to each constituent described in FIG. 14 and FIG. 15, and descriptions thereof will be omitted.

The electronic component 61 further includes the surface insulating film 34, the heat dissipation member 35, and the external conductive film 39 (also see FIG. 7), in the present modification. The heat dissipation member 35 is connected to a whole region of the first non-mounting surface 80*b* of the first chip body 80.

The heat generated at the first chip 66 can thus be transmitted from the non-mounting surface 20*b* to the heat dissipation member 35. The rise in temperature of the first chip 66 and the rise in temperature of the inside of the sealing resin 30 can thereby be effectively restrained. The rise in temperature of the second chips 68A to 68D can also be effectively restrain.

According to the electronic component 61, the heat dissipation member 35 includes the first metallic layer 36, in the present modification. The first metallic layer 36 forms the ohmic contact with the first non-mounting surface 80*b* of the first chip body 80. This ohmic contact is realized by the AuSi eutectic alloy layer 38 formed in the region between the non-mounting surface 20*b* of the chip body 20 and the first metallic layer 36.

The formation of the Schottky barrier diode at the first non-mounting surface 80*b* of the first chip body 80 can thus be effectively restrained. The rise in temperature of the chip 3 can thereby be restrained while enhancing an electric stability of the chip 3.

Figure 18:
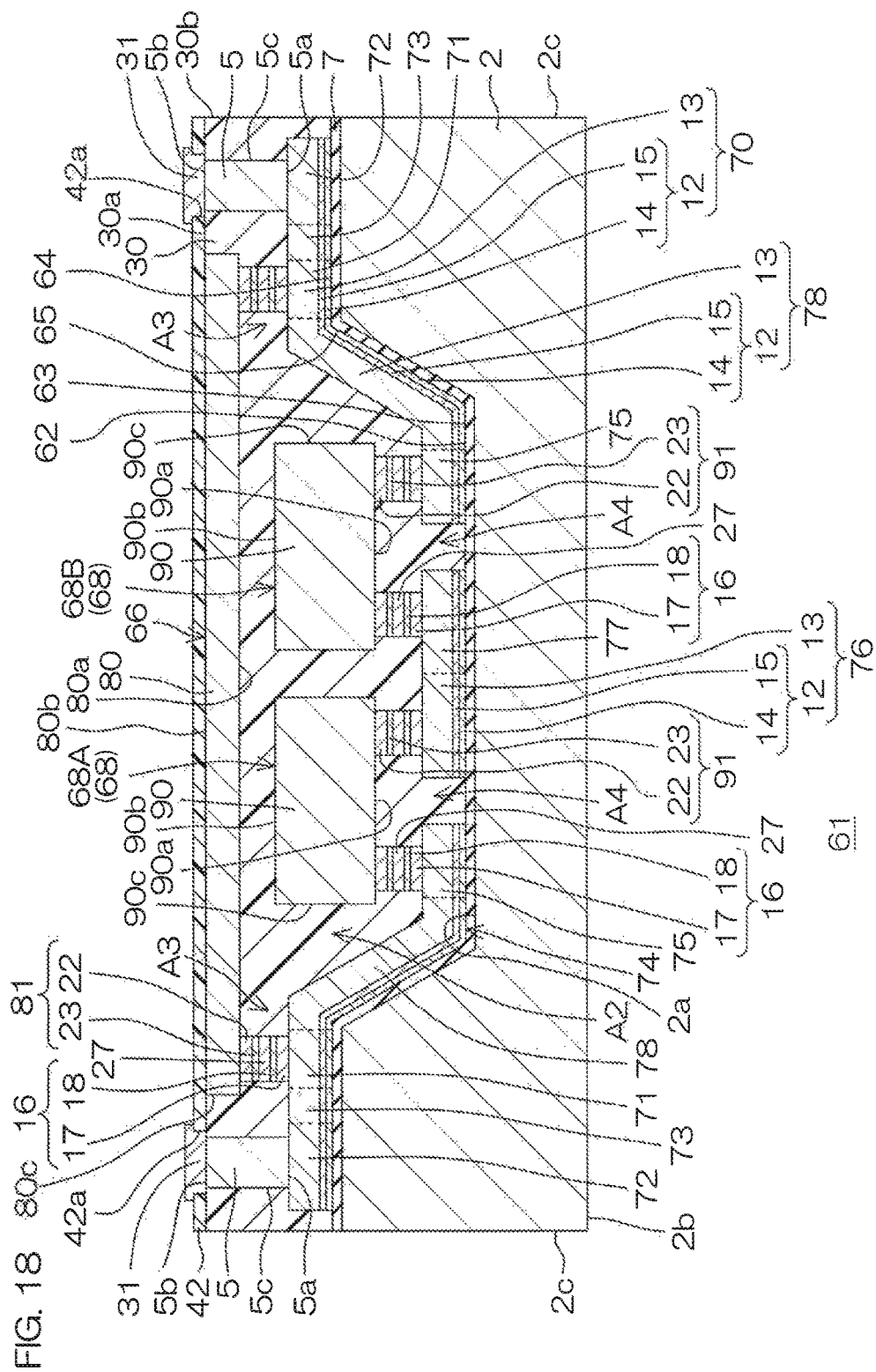
FIG. 18 is a cross-sectional view showing a third modification of the electronic component of FIG. 14.

FIG. 18 is a cross-sectional view showing a third modification of the electronic component 61 of FIG. 14. In FIG. 18, the same reference sign is given to a constituent equivalent to each constituent described in FIG. 14 and FIG. 15, and descriptions thereof will be omitted.

The electronic component 61 further includes the surface insulating film 42 (also see FIG. 8), in the third modification. A whole region of the first non-mounting surface 80*b* of the first chip body 80 is covered with the surface insulating film 42. The chip 3 can thereby be protected by the surface insulating film 42.

According to the electronic component 61 of the present modification, the first non-mounting surface 80*b* of the first chip body 80 is covered with the surface insulating film 42. The effect of restraining the rise in temperature of the first chip 66 is can thus be small.

However, a market demand that desires achieving the low profile while an arrangement in which the first chip 66 is exposed from the sealing resin 30 is not desired can be met.

According to the electronic component 61 of the present modification, the mask in the step (step S9) of forming the external conductive film 31 can be used as the surface insulating film 42 as it is. The electronic component 61 that has the surface insulating film 42 can thereby be manufactured without consuming much time.

Figure 19:
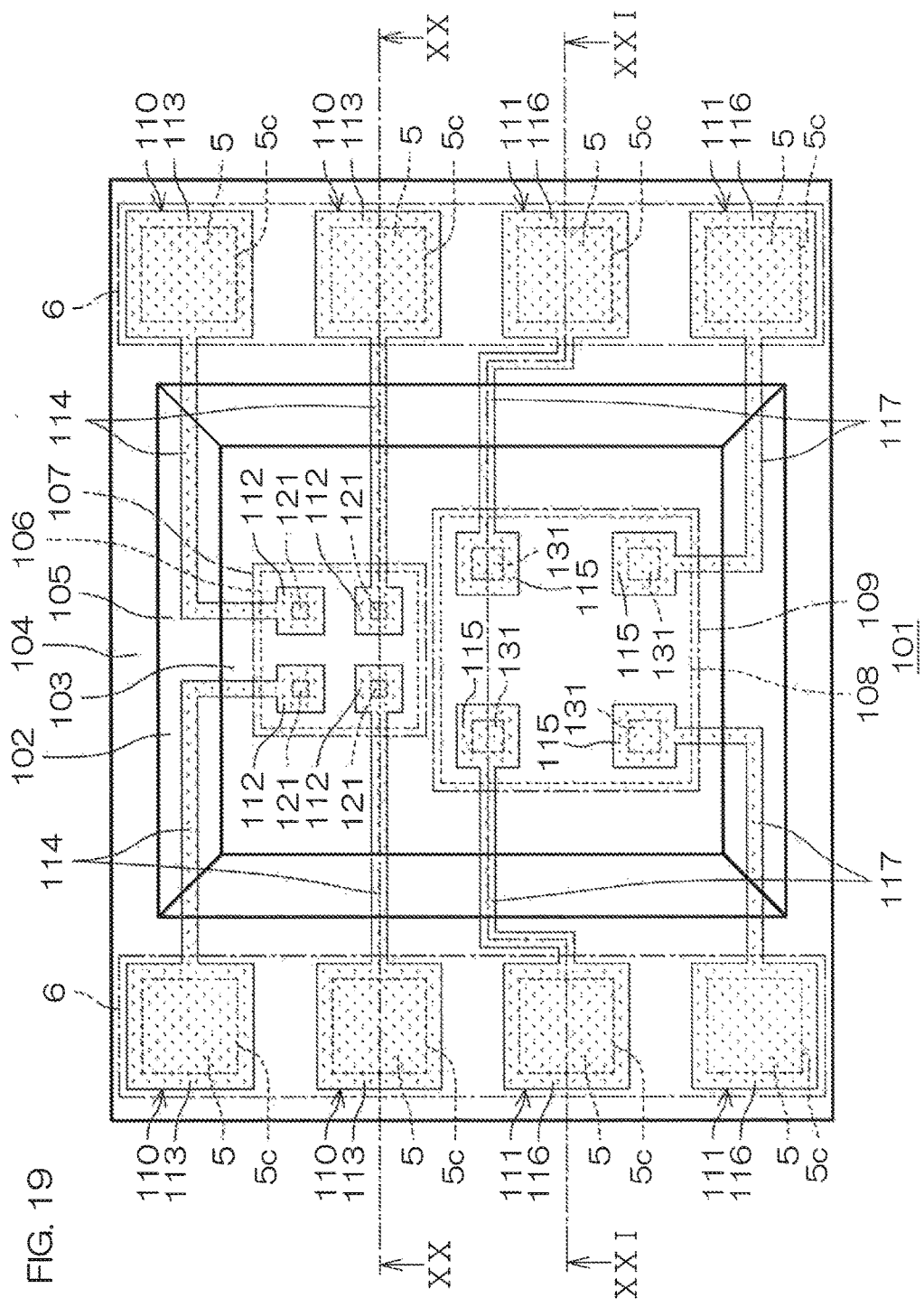
FIG. 19 is a plan view showing an electronic component according to a fourth preferred embodiment of the present invention.
Figure 20:
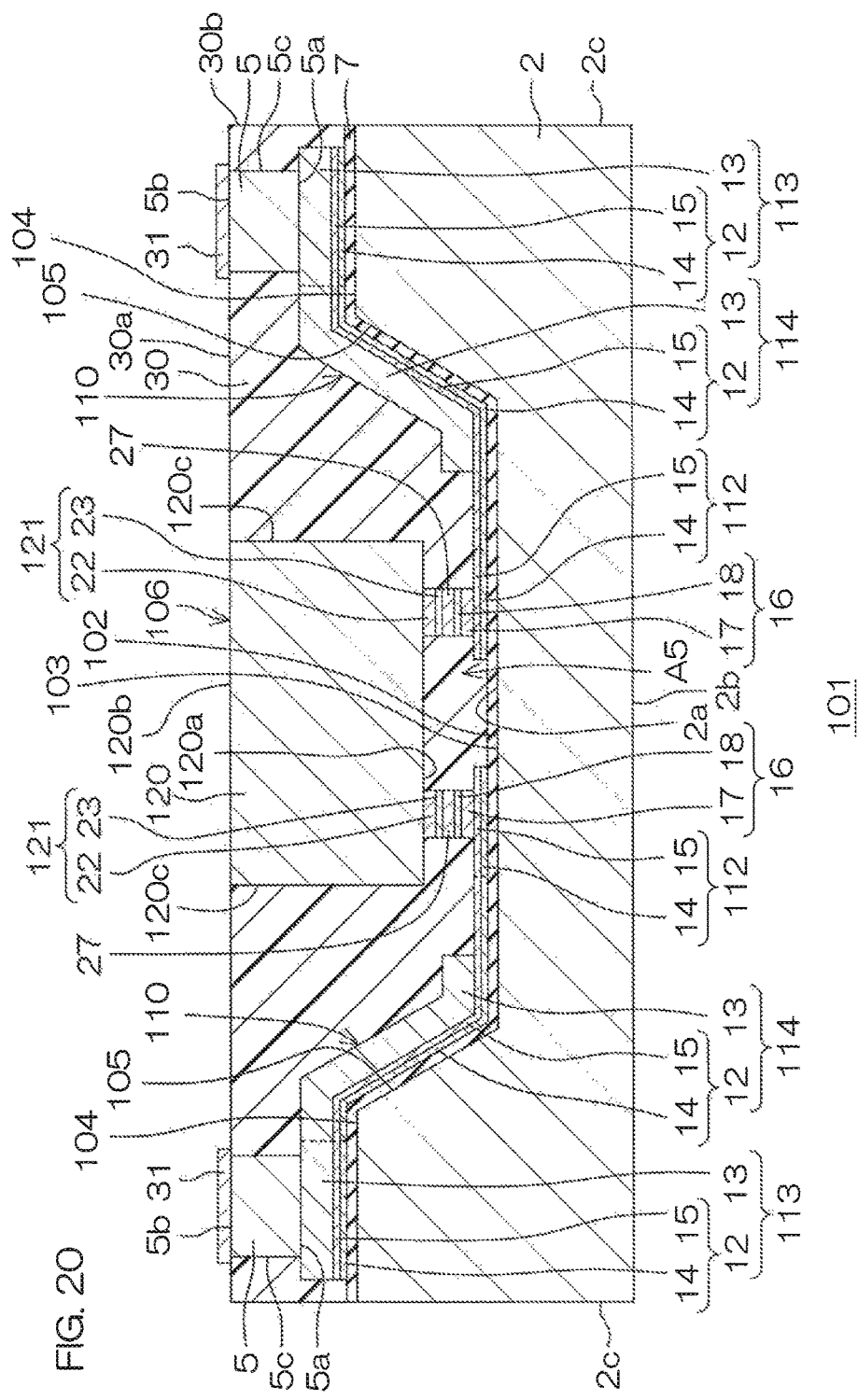
FIG. 20 is a cross-sectional view taken along line XX-XX of FIG. 19.
Figure 21:
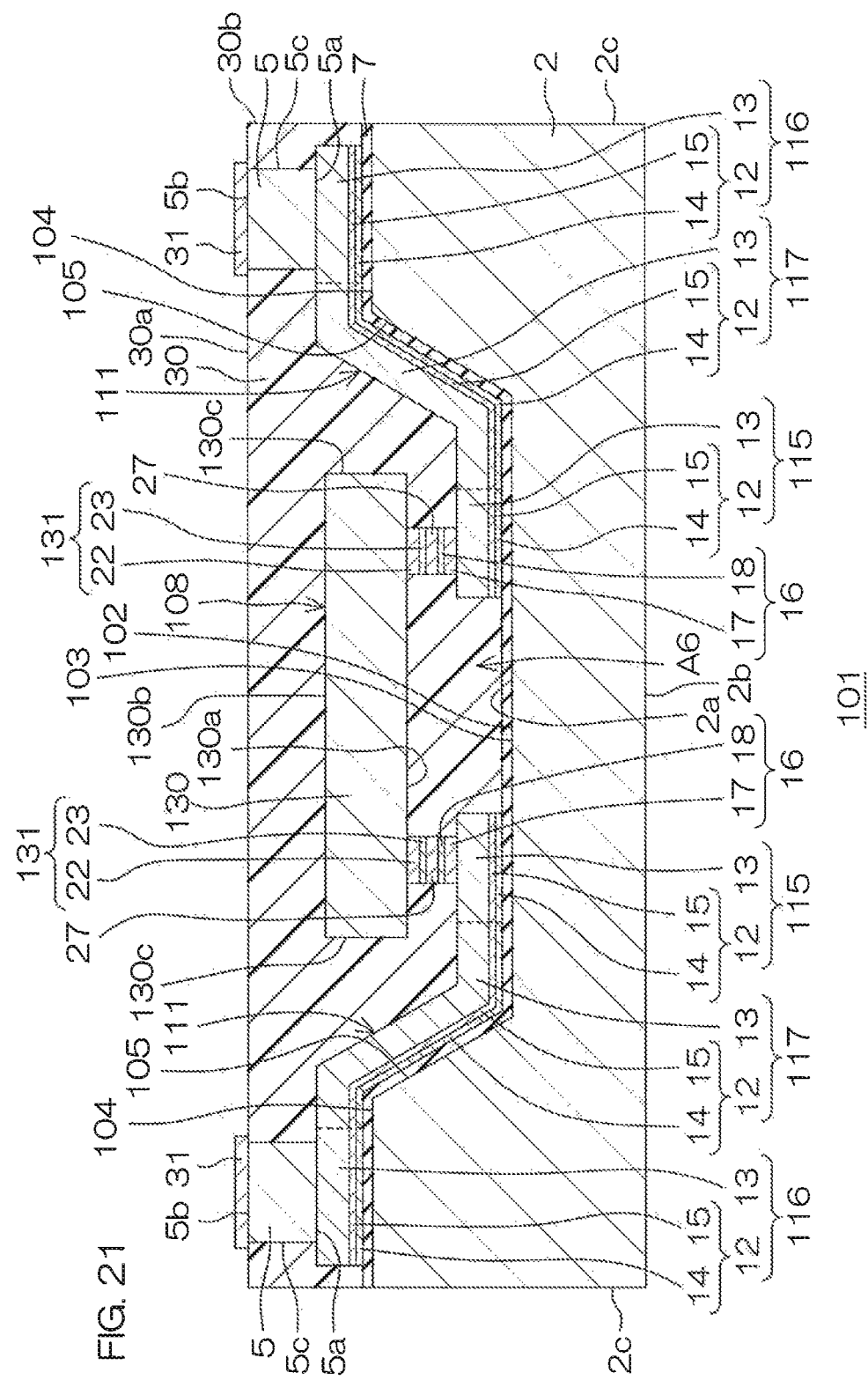
FIG. 21 is a cross-sectional view taken along line XXI-XXI of FIG. 19.

FIG. 19 is a plan view showing an electronic component 101 according to a fourth preferred embodiment of the present invention. FIG. 20 is a cross-sectional view taken along line XX-XX of FIG. 19. FIG. 21 is a cross-sectional view taken along line XXI-XXI of FIG. 19. In FIG. 19 to FIG. 21, the same reference sign is given to a constituent equivalent to each constituent described in the first preferred embodiment, and descriptions thereof will be omitted.

Referring to FIG. 19 to FIG. 21, a recessed portion 102 that is recessed toward the second principal surface 2b is formed at the first principal surface 2a of the interposer 2. The second principal surface 2b of the interposer 2 is formed flatly.

The recessed portion 102 is formed at a central portion of the first principal surface 2a of the interposer 2, in the present preferred embodiment. The recessed portion 102 is formed so as to have an interval inwardly from the peripheral edge of the interposer 2. The recessed portion 102 is formed in a quadrangular shape parallel to each side of the interposer 2 in plan view.

A low region portion 103 that is formed by a bottom of the recessed portion 102, a high region portion 104 that is formed by a region surrounding the recessed portion 102, and a connection portion 105 that connects the low region portion 103 and the high region portion 104 are formed at the first principal surface 2a of the interposer 2. The low region portion 103 is formed in a quadrangular shape parallel to each side of the interposer 2 in plan view. The high region portion 104 is formed in a quadrangular ring shape that surrounds the recessed portion 102 in plan view.

The recessed portion 102 is formed in a tapered shape in which a width of an opening gradually becomes narrower from the high region portion 104 toward the low region portion 103 in a cross-sectional view. The connection portion 105 has an inclined surface that is inclined downwardly from the high region portion 104 toward the low region portion 103.

A first chip arrangement region 107 and a second chip arrangement region 109 are set at the low region portion 103. The first chip arrangement region 107 and the second chip arrangement region 109 are arranged at intervals along the short-side lateral direction of the interposer 2.

The first chip arrangement region 107 is a region in which the first chip 106 is arranged. The first chip arrangement region 107 is set in a quadrangular shape parallel to each side of the interposer 2 in plan view.

The second chip arrangement region 109 is a region in which the second chip 108 is arranged. The second chip arrangement region 109 is set in a quadrangular shape parallel to each side of the interposer 2 in plan view.

The outer terminal arrangement region 6 is set in a region between the one short-side surface 2c of the interposer 2 and the recessed portion 102. The outer terminal arrangement region 6 is also set in a region between the other short-side surface 2c of the interposer 2 and the recessed portion 102.

Referring to FIG. 19 and FIG. 20, the insulating film 7 is formed on the first principal surface 2a of the interposer 2. A plurality of first wiring films 110 (in the present preferred embodiment, four first wiring films) that are electrically connected to the first chip 106 are formed on the insulating film 7.

Each of the plurality of first wiring films 110 includes a first pad region 112, a second pad region 113, and a first connection region 114. The first pad region 112 is arranged in the first chip arrangement region 107. The second pad region 113 is arranged in the outer terminal arrangement region 6. The first connection region 114 connects the first pad region 112 and the second pad region 113.

Two first pad regions 112 are arranged in a region at the one short-side surface 2c side of the interposer 2 in the first chip arrangement region 107. These two first pad regions 112 are arranged at intervals along the short-side lateral direction of the interposer 2.

Two first pad regions 112 are arranged in a region at the other short-side surface 2c side of the interposer 2 in the first chip arrangement region 107. These two first pad regions 112 are arranged at intervals along the short-side lateral direction of the interposer 2. Each first pad region 112 may be formed in a quadrangular shape in plan view.

Two second pad regions 113 are arranged in the outer terminal arrangement region 6 at the one short-side surface 2c side of the interposer 2. These two second pad regions 113 are arranged at intervals along the short-side lateral direction of the interposer 2.

Two second pad regions 113 are arranged in the outer terminal arrangement region 6 at the other short-side surface 2c side of the interposer 2. These two second pad regions 113 are arranged at intervals along the short-side lateral direction of the interposer 2. Each second pad region 113 may be formed in a quadrangular shape in plan view.

The first connection region 114 is connected to the corresponding first pad region 112 and to the corresponding second pad region 113. The first connection region 114 is selectively laid around in a region between the corresponding first pad region 112 and the corresponding second pad region 113.

Referring to FIG. 20, the first wiring film 110 has a laminated structure including the seed layer 12 and the conductive layer 13. The conductive layer 13 exposes the seed layer 12 formed in the first pad region 112.

Therefore, the first pad region 112 is made of the seed layer 12. On the other hand, the second pad region 113 and the first connection region 114 are each made of a laminated structure including the seed layer 12 and the conductive layer 13.

The first pad region 112 is thus formed as a thin film portion having a thickness smaller than each thickness of other portions. The thickness of the first pad region 112 is smaller than the thickness of the second pad region 113 and the thickness of the first connection region 114.

Referring to FIG. 19 and FIG. 21, a plurality of second wiring films 111 (in the present preferred embodiment, four second wiring films) that are electrically connected to the second chip 108 are formed on the insulating film 7. Each of the plurality of second wiring films 111 includes a third pad region 115, a fourth pad region 116, and a second connection region 117.

The third pad region 115 is arranged in the second chip arrangement region 109. The fourth pad region 116 is arranged in the outer terminal arrangement region 6. The second connection region 117 connects the third pad region 115 and the fourth pad region 116.

Two third pad regions 115 are arranged in a region at the one short-side surface 2c side of the interposer 2 in the second chip arrangement region 109. These two third pad regions 115 are arranged at intervals along the short-side lateral direction of the interposer 2.

Two third pad regions 115 are arranged in a region at the other short-side surface 2c side of the interposer 2 in the second chip arrangement region 109. These two third pad regions 115 are arranged at intervals along the short-side lateral direction of the interposer 2. Each third pad region 115 may be formed in a quadrangular shape in plan view.

Two fourth pad regions 116 are arranged in the outer terminal arrangement region 6 at the one short-side surface 2c side of the interposer 2. These two fourth pad region 116 are arranged at intervals along the short-side lateral direction of the interposer 2.

Two fourth pad regions 116 are arranged in the outer terminal arrangement region 6 at the other short-side surface 2c side of the interposer 2. These two fourth pad regions 116 are arranged at intervals along the short-side lateral direction of the interposer 2. Each fourth pad region 116 may be formed in a quadrangular shape in plan view.

The second connection region 117 is connected to the corresponding third pad region 115 and to the corresponding fourth pad region 116. The second connection region 117 is selectively laid around in a region between the corresponding third pad region 115 and the corresponding fourth pad region 116.

Referring to FIG. 21, the second wiring film 111 has a laminated structure including the seed layer 12 and the conductive layer 13. The second wiring film 111 is formed with a uniform thickness, unlike the first wiring film 110.

Referring to FIG. 19 and FIG. 20, the first chip 106 is arranged in the first chip arrangement region 107. The first chip 106 includes a first chip body 120. The first chip body 120 is formed in a rectangular parallelepiped shape. The first chip body 120 may be made of silicon, GaAs, or an insulating material. The insulating material may include glass or ceramic.

The first chip body 120 has a first mounting surface 120a, a first non-mounting surface 120b positioned on a side opposite to the first mounting surface 120a, and a first side surfaces 120c that connect the first mounting surface 120a and the first non-mounting surface 120b. The first mounting surface 120a is a facing surface that faces the interposer 2 when the first chip 106 is mounted on the interposer 2.

The first mounting surface 120a of the first chip body 120 may be a functional element forming surface on which a functional element is formed. The functional element may include at least one of a resistor, a capacitor, a coil, a diode, or a transistor. The first chip 106 may be a chip that includes a monofunctional element, or may be a chip that includes an integrated circuit having a plurality of functional elements.

A plurality of first terminal electrodes 121 are formed on the first mounting surface 120a of the first chip body 120. The plurality of first terminal electrodes 121 are electrically connected to the functional elements. The first terminal electrode 121 has a laminated structure including the main body portion 22 and the barrier layer 23.

An insulating layer may be formed on the first mounting surface 120a of the first chip body 120. In this case, the plurality of first terminal electrodes 121 may protrude outwardly from the insulating layer. A wiring layer that includes wires that electrically connect the plurality of first terminal electrodes 121 and the functional element may be selectively formed at the insulating layer.

The first chip 106 is arranged at the first principal surface 2a of the interposer 2 in a posture in which the first mounting surface 120a of the first chip body 120 faces the first principal surface 2a of the interposer 2. Each first terminal electrode 121 is connected to the corresponding first wiring film 110 via the connecting electrode 16.

The first chip 106 is electrically connected to the plurality of first wiring films 110. The first terminal electrode 121 may be connected to the connecting electrode 16 via the conductive bonding material 27. The main body portion 17 of the connecting electrode 16 and the main body portion 22 of the first terminal electrode 121 may be directly connected to each other by a known ultrasonic connecting method.

The first chip 106 is accommodated in the recessed portion 102 of the interposer 2. The first mounting surface 120a of the first chip body 120 is positioned inside the recessed portion 102. On the other hand, the first non-mounting surface 120b of the first chip body 120 is positioned above the high region portion 104.

As thus described, the first chip 106 is accommodated in the recessed portion 102 at a height at which the high region portion 104 of the interposer 2 is positioned in a region between the first mounting surface 120a and the first non-mounting surface 120b of the first chip body 120.

An area of the first mounting surface 120a of the first chip body 120 is smaller than an area of the low region portion 103 in plan view. A whole region of a peripheral edge of the first chip 106 is positioned in a region surrounded by a peripheral edge of the low region portion 103 in plan view.

A whole area of the first mounting surface 120a of the first chip body 120 faces the low region portion 103. The first mounting surface 120a of the first chip body 120 may face the low region portion 103 and the connection portion 105.

Referring to FIG. 19 and FIG. 21, the second chip 108 is arranged in the second chip arrangement region 109. The second chip 108 has a thickness smaller than a thickness of the first chip 106. The second chip 108 has an operating current larger than an operating current of the first chip 106. Therefore, a larger electric current is supplied to the second chip 108 than to the first chip 106.

The second chip 108 includes a second chip body 130. The second chip body 130 is formed in a rectangular parallelepiped shape. The second chip body 130 may be made of silicon, GaAs, or an insulating material. The insulating material may include glass or ceramic.

The second chip body 130 has a second mounting surface 130a, a second non-mounting surface 130b positioned on a side opposite to the second mounting surface 130a, and a second side surfaces 130c that connect the second mounting surface 130a and the second non-mounting surface 130b. The second mounting surface 130a is a facing surface that faces the interposer 2 when the second chip 108 is mounted on the interposer 2.

The second mounting surface 130a of the second chip body 130 may be a functional element forming surface on which a functional element is formed. The functional element may include at least one of a resistor, a capacitor, a coil, a diode, or a transistor. The second chip 108 may be a chip that includes a monofunctional element, or may be a chip that includes an integrated circuit having a plurality of functional elements.

A plurality of second terminal electrodes 131 are formed on the second mounting surface 130a of the second chip body 130. The plurality of second terminal electrodes 131 are electrically connected to the functional elements. The second terminal electrode 131 has a laminated structure including the main body portion 22 and the barrier layer 23.

An insulating layer may be formed on the second mounting surface 130a of the second chip body 130. In this case, the plurality of second terminal electrodes 131 may protrude outwardly from the insulating layer. A wiring layer that includes wires that electrically connect the plurality of second terminal electrodes 131 and the functional element may be selectively formed at the insulating layer.

The second chip 108 is arranged at the first principal surface 2a of the interposer 2 in a posture in which the second mounting surface 130a of the second chip body 130 faces the first principal surface 2a of the interposer 2. Each second terminal electrode 131 is connected to the corresponding second wiring film 111 via the connecting electrode 16.

The second chip 108 is thus electrically connected to the plurality of second wiring films 111. The second terminal electrode 131 may be connected to the connecting electrode 16 via the conductive bonding material 27. The main body portion 17 of the connecting electrode 16 and the main body portion 22 of the second terminal electrode 131 may be directly connected to each other by a known ultrasonic connecting method.

The second chip 108 is accommodated in the recessed portion 102 of the interposer 2. The second non-mounting surface 130b of the second chip 108 is positioned in a region between the first non-mounting surface 120b of the first chip body 120 and the low region portion 103.

The second non-mounting surface 130b of the second chip 108 may be positioned in a region between the first non-mounting surface 120b of the first chip body 120 and the low region portion 103. The second mounting surface 130a and the second non-mounting surface 130b of the second chip body 130 may be positioned in the recessed portion 102. The second mounting surface 130a and the second non-mounting surface 130b of the second chip body 130 may be positioned in a region between the low region portion 103 and the high region portion 104.

An area of the second mounting surface 130a of the second chip body 130 is smaller than an area of the low region portion 103 in plan view. A whole region of a peripheral edge of the second chip 108 is positioned in a region surrounded by a peripheral edge of the low region portion 103 in plan view.

A whole region of the second mounting surface 130a of the second chip body 130 faces the low region portion 103. The second mounting surface 130a of the second chip body 130 may face the low region portion 103 and the connection portion 105.

The outer terminal 5 is formed on each of the plurality of second pad regions 113 and on each of the plurality of the fourth pad regions 116 in the outer terminal arrangement region 6. The sealing resin 30 is formed on the first principal surface 2a of the interposer 2.

The sealing resin 30 seals the first chip 106 so as to expose a whole region of the first non-mounting surface 120b of the first chip body 120. The sealing resin 30 further seals the second chip 108 so as to cover a whole region of the second non-mounting surface 130b of the second chip body 130. The sealing resin 30 seals each outer terminal 5 so as to expose the whole region of the opposite end surface 5b of each outer terminal 5.

The first non-mounting surface 120b of the first chip body 120, the opposite end surface 5b of each outer terminal 5, and the sealing principal surface 30a of the sealing resin 30 are connected without differences in level. The first non-mounting surface 120b of the first chip body 120, the opposite end surface 5b of each outer terminal 5, and the sealing principal surface 30a of the sealing resin 30 form a single flat surface. This single flat surface is formed in parallel with the second principal surface 2b of the interposer 2.

As described above, according to the electronic component 101, the first non-mounting surface 120b of the first chip 106 is exposed from the sealing resin 30. The heat generated at the first chip 106 can thus be dissipated to outside via the first non-mounting surface 120b. A rise in temperature of the first chip 106 and a rise in temperature of the inside of the sealing resin 30 can thus be restrained. A rise in temperature of the second chip 108 can also be restrained by the heat dissipation via the first chip 106.

Particularly, according to the electronic component 101, the whole region of the first non-mounting surface 80b of the first chip 106 is exposed from the sealing resin 30. The heat generated at the first chip 106 is dissipated to outside via the whole region of the first non-mounting surface 80b. The rise in temperature of the chip 3 can thereby be effectively restrained. The electronic component 101 being excellent in reliability can thereby be provided.

According to the electronic component 101, both the first chip 106 and the second chip 108 are accommodated in the recessed portion 102. The electronic component 101 can thus be provided as a multifunctional element-type electronic component.

In this structure, the circuit network including the first chip 106 and the second chip 108 can be two-dimensionally mounted (2D mounting) on the mounting substrate through a single step in which the electronic component 101 is mounted on the mounting substrate. The circuit network including the first chip 106 and the second chip 108 can thereby be mounted on the mounting substrate without consuming much time. The occupied area of the circuit network including the first chip 106 and the second chip 108 with respect to the mounting substrate can thereby be reduced. The circuit network including the first chip 106 and the second chip 108 can thus be high-densely mounted on the mounting substrate. Therefore, the mounting board can also be miniaturized.

According to the electronic component 101, both the first chip 106 and the second chip 108 are accommodated in the recessed portion 102 formed at the first principal surface 2a of the interposer 2. The low profile of the electronic component 101 can thereby be achieved by an amount corresponding to the depth of the recessed portion 102 while raising the heat radiation property.

Particularly, according the electronic component 101, the first chip 106 that has the thickness larger than the thickness of the second chip 108 is connected to a thin film portion (first pad region 112) of the first wiring film 110.

The distance between the first non-mounting surface 120b of the first chip body 120 and the low region portion 103 can thus be narrowed by an amount corresponding to the thinned first pad region 112. The further low profile of the electronic component 101 can thereby be achieved.

A wiring resistance of the first pad region 112 is larger than a wiring resistance of the second pad region 113 and a wiring resistance of the first connection region 114. However, both the second pad region 113 and the first connection region 114 are larger in thickness than the first pad region 112.

Moreover, the second pad region 113 and the first connection region 114 each have the conductive layer 13 whose thickness is larger than the thickness of the seed layer 12. Therefore, an increase in wiring resistance is restrained when the whole of the first wiring film 110 is viewed.

Moreover, the first chip 106 having the operating current smaller than the operating current of the second chip 108 is connected to the first wiring film 110. A power consumption can thereby be reduced by restraining the increase in the wiring resistance in the circuit at the first chip 106 side.

On the other hand, the second chip 108 having the operating current larger than the operating current of the first chip 106 is connected to the second wiring film 111 having the uniform thickness. This second wiring film 111 includes the conductive layer 13 having the thickness larger than the thickness of the seed layer 12 over the whole region of the second wiring film 111. A power consumption can thereby be reduced by restraining the increase in the wiring resistance in the circuit at the second chip 108 side.

According to the electronic component 101, a space A5 is formed in a region between the first mounting surface 120a of the first chip body 120 and the low region portion 103 by the plurality of connecting electrodes 16. This space A5 is set to a height enough to fill the sealing resin 30.

The sealing resin 30 can thus be satisfactorily filled in a region between the first mounting surface 120a of the first chip body 120 and the low region portion 103 by the space A5. A formation of a void (empty hole) in the sealing resin 30 that is filled into the space A5 can thus be restrained.

A whole region of each outer surface of the connecting electrode 16, the first terminal electrode 121, and the conductive bonding material 27 can thus be coated with the sealing resin 30. Corrosion of the connecting electrode 16, the first terminal electrode 121, and the conductive bonding material 27 by moisture to be stored in the void (empty hole) can thereby be restrained.

According to the electronic component 101, a space A6 is formed in a region between the second mounting surface 130a of the second chip body 130 and the low region portion 103 by the plurality of connecting electrodes 16. This space A6 is set to a height enough to fill the sealing resin 30.

The sealing resin 30 can thus be satisfactorily filled in a region between the second mounting surface 130a of the second chip body 130 and the low region portion 103 by the space A6. A formation of a void (empty hole) in the sealing resin 30 that is filled into the space A6 can thus be restrained.

A whole region of each outer surface of the connecting electrode 16, the second terminal electrode 131, and the conductive bonding material 27 can thus be coated with the sealing resin 30. Corrosion of the connecting electrode 16, the second terminal electrode 131, and the conductive bonding material 27 by moisture to be stored in the void (empty hole) can thereby be restrained.

As not shown, the electronic component 101 may further include the heat dissipation member 32 (also see FIG. 6). The heat dissipation member 32 may be connected to a whole region of the first non-mounting surface 120b of the first chip body 120.

The heat generated at the first chip 106 can thus be transmitted to the heat dissipation member 32 from the first non-mounting surface 120b. The rise in temperature of the first chip 106 and the rise in temperature of the inside of the sealing resin 30 can thereby be effectively restrained. The rise in temperature of the second chip 108 can also be effectively restrained.

As not shown, the electronic component 101 may further include the surface insulating film 34, the heat dissipation member 35, and the external conductive film 39, (also see FIG. 7). The heat dissipation member 35 may be connected to a whole region of the first non-mounting surface 120b of the first chip body 120.

The heat generated at the first chip 106 can thus be transmitted to the heat dissipation member 35 from the first non-mounting surface 120b. The rise in temperature of the first chip 106 and the rise in temperature of the inside of the sealing resin 30 can thereby be effectively restrained. The rise in temperature of the second chip 108 can also be effectively restrained.

The heat dissipation member 35 includes the first metallic layer 36. The first metallic layer 36 forms the ohmic contact with the first non-mounting surface 120b of the first chip body 120. This ohmic contact is realized by the AuSi eutectic alloy layer 38 formed at the first non-mounting surface 120b of the first chip body 120.

The formation of the Schottky barrier diode at the first non-mounting surface 120b of the first chip body 120 can thus be effectively restrained. The rise in temperature of the first chip 106 can thereby be restrained while enhancing an electric stability of the first chip 106.

As not shown, the electronic component 101 may further include the surface insulating film 42 (also see FIG. 8). The surface insulating film 42 may cover a whole region of the first non-mounting surface 120b of the first chip body 120. The first chip 106 can be protected by the surface insulating film 42.

According to this structure, the first non-mounting surface 120b of the first chip body 120 is covered with the surface insulating film 42. The effect of restraining the rise in temperature of the first chip 106 can thus be small. However, a market demand that desires achieving a low profile while an arrangement in which the chip 3 is exposed from the sealing resin 30 is not desired can be met.

According to this structure, the mask used in the step (step S9) of forming the external conductive film 31 can also be used as the surface insulating film 42 as it is. The electronic component 101 that has the surface insulating film 42 can thereby be manufactured without consuming much time.

Figure 22:
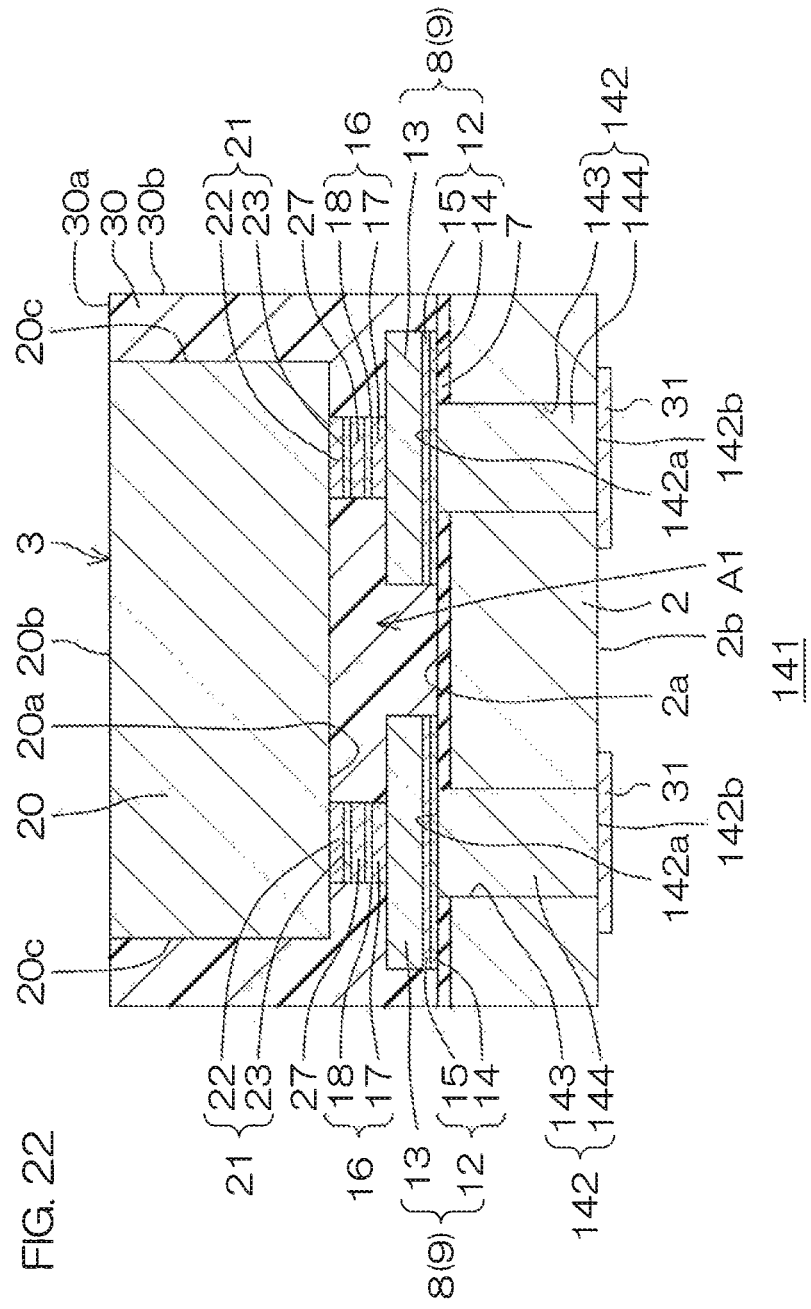
FIG. 22 is a cross-sectional view showing an electronic component according to a fifth preferred embodiment of the present invention.

FIG. 22 is a cross-sectional view showing an electronic component 141 according to a fifth preferred embodiment of the present invention. In FIG. 22, the same reference sign is given to a constituent equivalent to each constituent described in the first preferred embodiment, and descriptions thereof will be omitted.

In the electronic component 141, each of the plurality of wiring films 8 includes only the first pad region 9. A via electrode 142 is connected to each of the plurality of wiring films 8. The interposer 2 includes silicon, in the present preferred embodiment. Therefore, the via electrode 142 is a Through-Silicon Via (TSV).

A via hole 143 is formed in a region overlapping to each of the plurality of wiring films 8 in the interposer 2 in plan view. The via electrode 142 includes a conductive 144 embedded in the via hole 143.

Each of the plurality of via electrodes 142 has an upper end portion 142a and a lower end portion 142b. The upper end portion 142a of the via electrode 142 is connected to the corresponding wiring film 8. The lower end portion 142b of the via electrode 142 is exposed from the second principal surface 2b of the interposer 2.

The external conductive film 31 is connected to the lower end portion 142b of each via electrode 142. The external conductive film 31 has a laminated structure including an Ni layer, a Pd layer, and an Au layer laminated in this order from the lower end portion 142b side of the via electrode 142. The external conductive film 31 covers a whole region of the lower end portion 142b of the via electrode 142. The external conductive film 31 overlaps to the second principal surface 2b of the interposer 2.

As described above, according to the electronic component 141, the same effect as the effect described in the first preferred embodiment can also be realized.

Of course, an arrangement in which the via electrode 142 is formed instead of the outer terminal 5 is applicable to each arrangement of the first to fourth preferred embodiments. In this case, the via electrode 142 is connected to an arbitrary pad region included in the wiring film.

As not shown, the electronic component 141 may further include the heat dissipation member 32 (also see FIG. 6).

The heat dissipation member 32 may be connected to a whole region of the non-mounting surface 20b of the chip body 20.

The heat generated at the chip 3 can thus be efficiently transmitted to the heat dissipation member 32 from the non-mounting surface 20b. The rise in temperature of the chip 3 and the rise in temperature of the inside of the sealing resin 30 can thereby be effectively restrained.

As not shown, the electronic component 141 may further include the surface insulating film 34 and the heat dissipation member 35 (also see FIG. 7). The heat dissipation member 35 may be connected to a whole region of the non-mounting surface 20b of the chip body 20.

The heat generated in the chip 3 can thus be efficiently transmitted to the heat dissipation member 35 from the non-mounting surface 20b. The rise in temperature of the chip 3 and the rise in temperature of the inside of the sealing resin 30 can thereby be effectively restrained.

The heat dissipation member 35 includes the first metallic layer 36. The first metallic layer 36 forms the ohmic contact with the non-mounting surface 20b of the chip body 20. This ohmic contact is realized by the AuSi eutectic alloy layer 38 formed at the non-mounting surface 20b of the chip body 20.

The formation of the Schottky barrier diode at the non-mounting surface 20b of the chip body 20 can thus be effectively restrained. The rise in temperature of the chip 3 can thereby be restrained while enhancing an electric stability of the chip 3.

As not shown, the electronic component 141 may further include the surface insulating film 42 (also see FIG. 8). The surface insulating film 42 may cover a whole region of the non-mounting surface 20b of the chip body 20. The chip 3 can thereby be protected by the surface insulating film 42.

According to this structure, the non-mounting surface 20b of the chip body 20 is covered with the surface insulating film 42. The effect of restraining the rise in temperature of the chip 3 can thus be small. However, a market demand that desires achieving a low profile while an arrangement in which the chip 3 is exposed from the sealing resin 30 is not desired can be met.

According to this structure, the mask used in the step (step S9) of forming the external conductive film 31 can also be used as the surface insulating film 42 as it is. The electronic component 141 that has the surface insulating film 42 can thereby be manufactured without consuming much time.

Although the preferred embodiments of the present invention have been described above, the present invention can be embodied in still other modes.

In the first and fifth preferred embodiments, the first principal surface 2a of the interposer 2 may be roughened. The first principal surface 2a of the interposer 2 may be roughened by, for example, an etching method or the like.

An uneven structure may be formed on the first principal surface 2a of the interposer 2 as an example of a surface-roughening form. The uneven structure may include a plurality of recessed portions and a plurality of projecting portions. According to the first principal surface 2a roughened, the adhesive force of the insulating film 7, of the wiring film 8, of the sealing resin 30, or of the like with respect to the first principal surface 2a can be enhanced.

Figure 23:
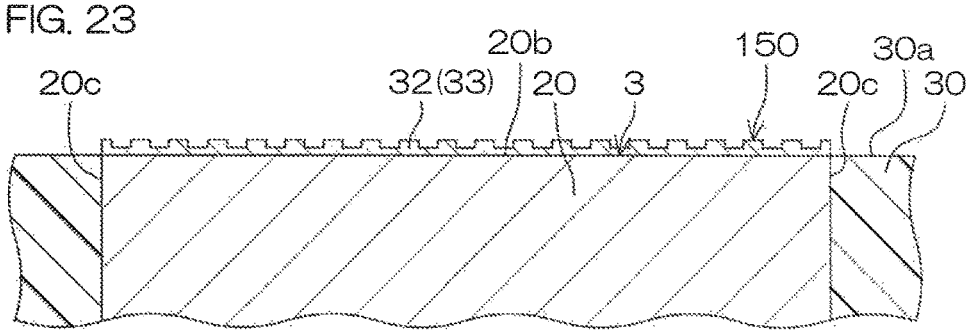
FIG. 23 is a cross-sectional view showing another example of a heat dissipation member of FIG. 6.

The heat dissipation member 32 applied in the first to fifth preferred embodiments may have a structure shown in FIG. 23. FIG. 23 is a cross-sectional view showing another form example of the heat dissipation member 32 of FIG. 6. In FIG. 23, the same reference sign is given to a constituent equivalent to each constituent described in the first preferred embodiment, and descriptions thereof will be omitted.

Referring to FIG. 23, the heat dissipation member 32 may have an uneven structure 150. The uneven structure 150 may include a plurality of recessed portions and a plurality of projecting portions. The uneven structure 150 can be formed by selectively removing a part of the heat dissipation member 32. The heat dissipation member 32 may be removed by an etching via a mask.

As described above, the heat dissipation member 32 has the uneven structure 150. The surface area of the heat dissipation member 32 is increased by the uneven structure 150. The heat dissipation capability by the heat dissipation member 32 can be rose. Of course, the heat dissipation member 32 including the plurality of uneven structure 150 is applicable to each arrangement of the second to fifth preferred embodiments although the structure of the first preferred embodiment is shown in the example of FIG. 23.

Figure 24:
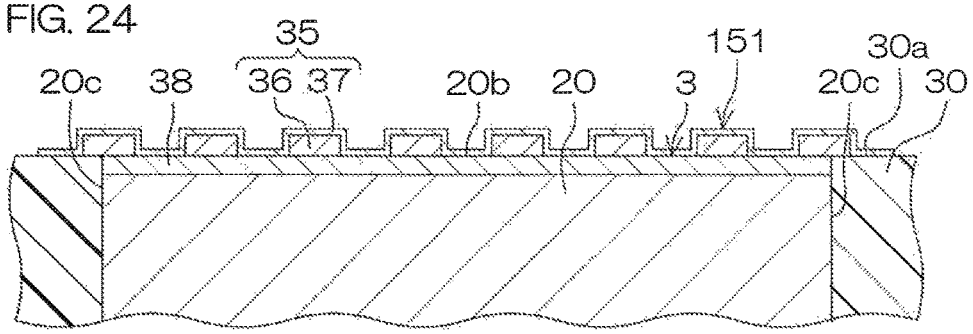
FIG. 24 is a cross-sectional view showing another example of a heat dissipation member of FIG. 7.

The heat dissipation member 35 applied to the first to fifth preferred embodiments may have a structure shown in FIG. 24. FIG. 24 is a cross-sectional view showing another form example of the heat dissipation member 35 of FIG. 7. In FIG. 24, the same reference sign is given to a constituent equivalent to each constituent described in the first preferred embodiment, and descriptions thereof will be omitted.

Referring to FIG. 24, the heat dissipation member 35 may have an uneven structure 151. The uneven structure 151 may include a plurality of recessed portions and a plurality of projecting portions. The uneven structure 151 can be formed by selectively removing a part of the heat dissipation member 35. The heat dissipation member 35 may be removed by an etching method via a mask.

The heat dissipation member 35 in this example includes a single or a plurality of first metallic layers 36 and second metallic layers 37. The single first metallic layer 36 may be formed in a grid-shaped manner in plan view. The plurality of first metallic layers 36 may be formed in a stripe manner extending in the same direction. The plurality of first metallic layers 36 may be formed in a discrete pattern or in a matrix pattern.

The second metallic layer 37 is formed on the non-mounting surface 20b of the chip body 20 so as to cover the plurality of first metallic layers 36. The second metallic layer 37 is formed in a film shape such that its one surface and its opposite surface are formed along the outer surface of the non-mounting surface 20b of the chip body 20 and the outer surface of the first metallic layer 36.

The uneven structure 151 are thus formed on the surface of the second metallic layer 37. The uneven structure 151 can be obtained, for example, by forming the film-shaped second metallic layer 37 after patterning the first metallic layer 36 selectively.

More specifically, first, the first metallic layer 36 having a uniform thickness is formed on the non-mounting surface 20b. Next, a part of the first metallic layer 36 having a uniform thickness is selectively removed. The first metallic layer 36 may be removed by an etching method via a mask. Next, the second film metallic layer 37 is formed so as to cover the first metallic layer 36.

As described above, the heat dissipation member 35 has the uneven structure 151. The surface area of the heat dissipation member 35 is increased by the uneven structure 151. The heat dissipation capability by the heat dissipation member 35 can thereby be rose. Of course, the heat dissipation member 35 including the uneven structure 151 is applicable to each arrangement of the second to fifth preferred embodiments although the structure of the first preferred embodiment is shown in the example of FIG. 24.

The present application corresponds to Japanese Patent Application No. 2016-92782 filed on May 2, 2016, at the Japan Patent Office, and the entire disclosure of the application is incorporated herein by reference.

Although the preferred embodiments of the present invention have been described in detail, these preferred embodiments are merely concrete examples used to clarify the technical contents of the present invention, and the present invention should not be understood by being limited to these concrete examples, and the scope of the present invention is limited solely by the appended claims.

What is claimed is:

1. An electronic component, comprising:
    a substrate that has a first principal surface and a second principal surface;
    a chip that includes a mounting surface on which a plurality of terminal electrodes are formed, and a non-mounting surface opposite to the mounting surface, the mounting surface facing the first principal surface of the substrate; and
    a sealing resin that is disposed on the first principal surface of the substrate, and seals the chip so as to expose the non-mounting surface of the chip, the sealing resin having an outer surface that is flush with the non-mounting surface of the chip.

2. The electronic component according to claim 1, further comprising a plurality of wiring films formed at the first principal surface of the substrate,
    wherein the chip is electrically connected to the plurality of wiring films, the mounting surface facing the first principal surface of the substrate so that the plurality of terminal electrodes are connected to the plurality of wiring films.

3. The electronic component according to claim 2, further comprising a plurality of outer terminals that are formed at the first principal surface of the substrate and that are electrically connected to the plurality of wiring films.

4. The electronic component according to claim 1, wherein the non-mounting surface of the chip is connected to the outer surface of the sealing resin without differences in level.

5. The electronic component according to claim 1, further comprising a heat dissipation member that has a thermal conductivity higher than that of the sealing resin and that covers the non-mounting surface of the chip.

6. The electronic component according to claim 5, wherein the heat dissipation member covers a whole area of the non-mounting surface of the chip.

7. The electronic component according to claim 5, wherein an uneven structure is formed in the heat dissipation member.

8. The electronic component according to claim 5, wherein the heat dissipation member includes a metallic layer.

9. The electronic component according to claim 5, wherein the heat dissipation member has a laminated structure in which a plurality of metallic layers are laminated.

10. The electronic component according to claim 1, wherein the first principal surface of the substrate is flatly formed.

11. The electronic component according to claim 1, wherein a recessed portion recessed toward the second principal surface is formed at the first principal surface of the substrate, and
    the chip is accommodated in the recessed portion of the substrate.

12. The electronic component according to claim 1, wherein a low region portion and a high region portion positioned at a higher position than the low region portion are defined by the recessed portion recessed toward the second principal surface at the first principal surface of the substrate, and
    the chip is bridged over the high region portion so as to cover the recessed portion, and defines a recessed space in a region between the mounting surface and the low region portion.

13. The electronic component according to claim 12, further comprising a lower side chip arranged in the recessed space,
    wherein the sealing resin seals the lower side chip in the recessed space.

14. The electronic component according to claim 13, wherein the lower side chip is electrically connected to the chip.

15. The electronic component according to claim 12, further comprising a plurality of lower side chips arranged in the recessed space,
    wherein the sealing resin seals the plurality of lower side chips in the recessed space.

16. The electronic component according to claim 15, wherein the plurality of lower side chips are electrically connected to each other.

17. The electronic component according to claim 15, wherein the plurality of lower side chips are electrically connected to the chip.

18. A method for manufacturing an electronic component comprising the steps of:
    preparing a substrate that has a first principal surface and a second principal surface;
    preparing a chip including a mounting surface on which a plurality of terminal electrodes are formed, and a non-mounting surface opposite to the mounting surface;
    arranging the chip and the substrate so that the first principal surface of the substrate faces the mounting surface of the chip; and
    forming a sealing resin that seals the chip so as to expose the non-mounting surface of the chip at the first principal surface of the substrate, the sealing resin having an outer surface formed flush with the non-mounting surface of the chip.

19. The method for manufacturing an electronic component according to claim 18, further comprising a step of forming a plurality of wiring films at the first principal surface of the substrate prior to the step of arranging the chip,
    wherein the step of arranging the chip includes a step of electrically connecting the chip to the plurality of wiring films in a posture in which the mounting surface faces the first principal surface of the substrate by allowing the plurality of terminal electrodes to be bonded to the plurality of wiring films.

20. The method for manufacturing an electronic component according to claim 18, wherein the step of forming the sealing resin includes,
    a step of supplying the sealing resin onto the first principal surface of the substrate so as to coat the non-mounting surface of the chip, and
    a step of grinding the sealing resin until the non-mounting surface of the chip is exposed.

21. The method for manufacturing an electronic component according to claim 20, wherein the step of grinding the sealing resin is served also as a step of thinning the chip by grinding the non-mounting surface.

\* \* \* \* \*